(12) United States Patent
Takojima et al.

(10) Patent No.: US 11,735,703 B2
(45) Date of Patent: Aug. 22, 2023

(54) LIGHT EMITTING DEVICE, METHOD OF MANUFACTURING LIGHT EMITTING DEVICE, AND LIGHTING TOOL FOR VEHICLE

(71) Applicant: NICHIA CORPORATION, Anan (JP)

(72) Inventors: Naoki Takojima, Asahikawa (JP); Kairi Makita, Asahikawa (JP); Fumio Ueno, Tokyo (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/452,433

(22) Filed: Oct. 27, 2021

(65) Prior Publication Data

US 2022/0045251 A1 Feb. 10, 2022

Related U.S. Application Data

(63) Continuation of application No. 16/713,256, filed on Dec. 13, 2019, now Pat. No. 11,189,768.

(30) Foreign Application Priority Data

Dec. 17, 2018 (JP) .................................. 2018-235711
Aug. 20, 2019 (JP) .................................. 2019-150652

(51) Int. Cl.
| | |
|---|---|
| *H01L 33/00* | (2010.01) |
| *H01L 33/62* | (2010.01) |
| *F21S 4/24* | (2016.01) |
| *H01L 21/66* | (2006.01) |
| *H01L 25/075* | (2006.01) |
| *F21S 43/14* | (2018.01) |

(52) U.S. Cl.
CPC ................ *H01L 33/62* (2013.01); *F21S 4/24* (2016.01); *F21S 43/14* (2018.01); *H01L 22/12* (2013.01); *H01L 25/0753* (2013.01); *H01L 2933/0066* (2013.01)

(58) Field of Classification Search
CPC ..... H01L 33/62; H01L 22/12; H01L 25/0753; H01L 2933/0066; H01L 25/167;
(Continued)

(56) References Cited

U.S. PATENT DOCUMENTS

| 6,449,836 B1 | 9/2002 | Miyake et al. |
| 10,461,063 B2 | 10/2019 | Maki |

(Continued)

FOREIGN PATENT DOCUMENTS

| CN | 105518885 A | 4/2016 |
| CN | 105518886 A | 4/2016 |

(Continued)

OTHER PUBLICATIONS

U.S. Appl. No. 16/988,938, filed Aug. 10, 2020, Kairi Makita.
Notice of Allowance dated Jan. 25, 2023 in U.S. Appl. No. 16/988,938.

*Primary Examiner* — Theresa T Doan
(74) *Attorney, Agent, or Firm* — Foley & Lardner LLP

(57) ABSTRACT

A light emitting device, according to the present embodiment, has a light emitting panel, a flexible wiring substrate, a mold resin and a protective tape. The light emitting panel has a first substrate, which is transparent to light, a plurality of conductor patterns, which are formed on a surface of the first substrate, a plurality of light emitting elements, which are connected to any of the conductor patterns, and a resin layer, which holds the light emitting elements on the first substrate. The flexible wiring substrate has a circuit pattern that is electrically connected with an exposed part of the conductor patterns. The mold resin covers the exposed part of the conductor patterns and an exposed part of the circuit pattern. The protective tape covers the mold resin, and is wound around a joint part of the light emitting panel and the flexible wiring substrate.

17 Claims, 31 Drawing Sheets

(58) Field of Classification Search
CPC ... H01L 33/52; H01L 2933/005; H01L 33/44;
H01L 33/54; H01L 2933/0025; F21S
4/24; F21S 43/14
USPC .......................................................... 257/88
See application file for complete search history.

(56) References Cited

U.S. PATENT DOCUMENTS

| | | | |
|---|---|---|---|
| 2001/0024460 A1* | 9/2001 | Yamamoto | H01L 24/73 |
| | | | 372/36 |
| 2011/0284822 A1* | 11/2011 | Jung | H01L 33/56 |
| | | | 257/E33.012 |
| 2012/0256187 A1 | 10/2012 | Yu et al. | |
| 2016/0233399 A1 | 8/2016 | Maki | |
| 2016/0276321 A1 | 9/2016 | Maki | |
| 2016/0276322 A1 | 9/2016 | Maki | |
| 2020/0013763 A1 | 1/2020 | Maki | |
| 2020/0072448 A1 | 3/2020 | Matsushita et al. | |
| 2020/0075558 A1 | 3/2020 | Jingi | |
| 2020/0279983 A1 | 9/2020 | Takojima et al. | |

FOREIGN PATENT DOCUMENTS

| | | |
|---|---|---|
| JP | 2001-223465 A | 8/2001 |
| JP | 2012-084855 A1 | 4/2012 |
| JP | WO 2015/083364 A1 | 6/2015 |
| JP | 6431485 B2 | 11/2018 |

* cited by examiner

FIG.14

| SAMPLE | MFR | NORMAL TEMPERATURE | PRESSURE COOKER TEST | WARM WATER IMMERSION TEST |
|--------|-----|--------------------|----------------------|---------------------------|
| A | 1.5 | 0/10 | 8/10 | 10/10 |
| B | 2 | 0/10 | 6/10 | 7/10 |
| C | 3 | 0/10 | 0/10 | 0/10 |
| D | 5.2 | 0/10 | 0/10 | 0/10 |
| E | 7.2 | 0/10 | 0/10 | 0/10 |
| F | 9.5 | 0/10 | 0/10 | 0/10 |
| G | 12.3 | 0/10 | 0/10 | 0/10 |
| H | 13 | 0/10 | 0/10 | 1/10 |
| I | 30 | 0/10 | 7/10 | 6/10 |
| J | 50 | 0/10 | 10/10 | 8/10 |

FIG.18
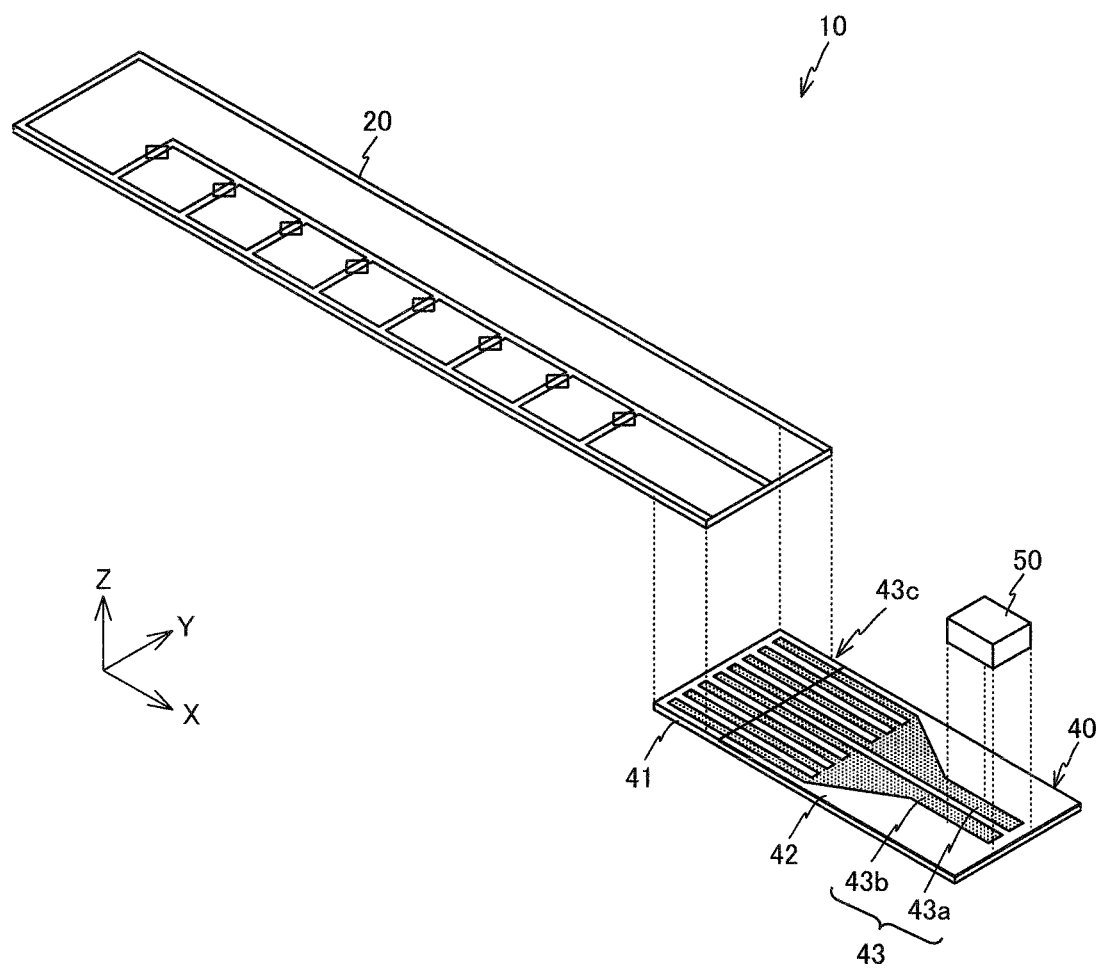
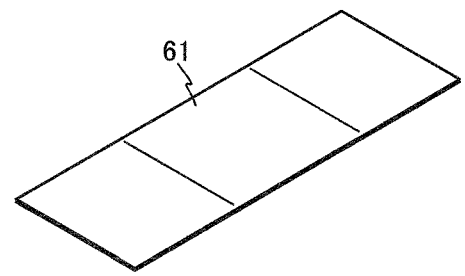

FIG.24
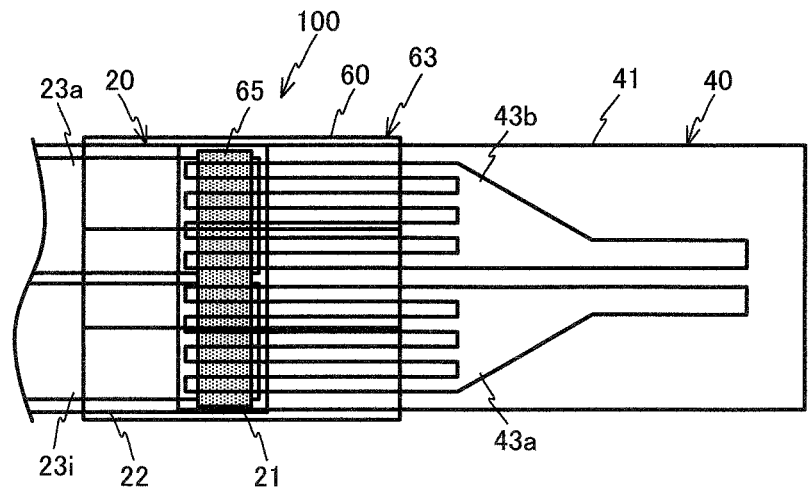
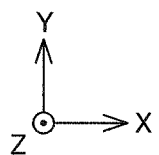
FIG.25
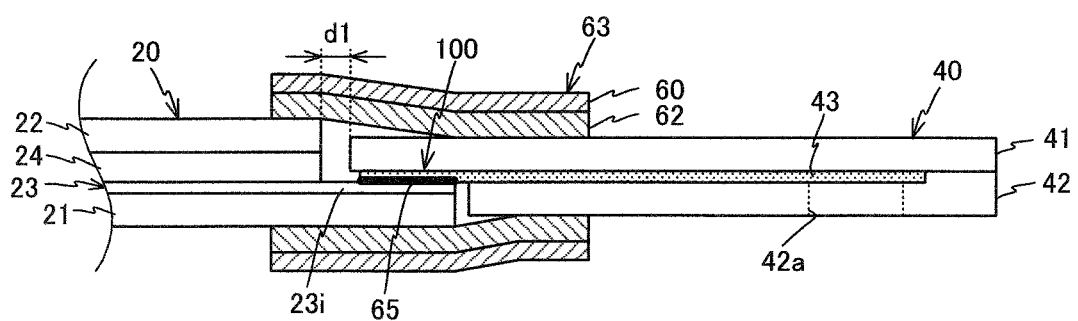
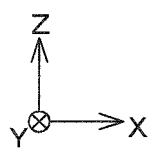

FIG.26
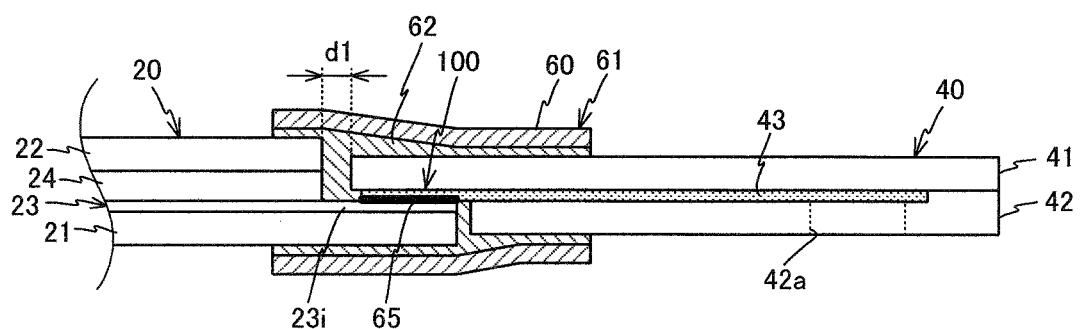
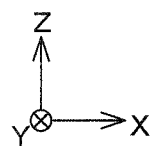

FIG.27

| | MOLD RESIN | PROTECTIVE TAPE | MOLD RESIN THICKNESS BEFORE PROCESSING (μm) | d1(mm) | CROSS-SECTIONAL VOID OBSERVATION TEST (NUMBER OF GOOD SAMPLES/NUMBER OF SAMPLES) | INFILTRATION SEARCH TEST (NUMBER OF GOOD SAMPLES/NUMBER OF SAMPLES) |
|---|---|---|---|---|---|---|
| EXAMPLE 1 | EPOXY RESIN | POLYIMIDE | 60 | 1.8 | 5/5 | 5/5 |
| EXAMPLE 2 | EPOXY RESIN | POLYIMIDE | 80 | 1.9 | 5/5 | 5/5 |
| EXAMPLE 3 | EPOXY RESIN | POLYIMIDE | 100 | 1.5 | 5/5 | 5/5 |
| EXAMPLE 4 | EPOXY RESIN | POLYIMIDE | 120 | 2.6 | 5/5 | 5/5 |
| EXAMPLE 5 | ACRYLIC RESIN | POLYIMIDE | 80 | 2.2 | 5/5 | 5/5 |
| EXAMPLE 6 | POLYIMIDE | PEEK | 80 | 1.7 | 5/5 | 5/5 |
| EXAMPLE 7 | EPOXY RESIN | POLYIMIDE | 80 | 1.3 | 5/5 | 5/5 |
| EXAMPLE 8 | EPOXY RESIN | POLYIMIDE | 80 | 4.5 | 5/5 | 5/5 |
| COMPARATIVE EXAMPLE 1 | EPOXY RESIN | POLYIMIDE | 40 | 1.8 | 4/5 | 2/5 |
| COMPARATIVE EXAMPLE 2 | EPOXY RESIN | POLYIMIDE | 140 | 1.9 | 5/5 | 5/5 |
| COMPARATIVE EXAMPLE 3 | EPOXY RESIN | — | 80 | 1.9 | 5/5 | 4/5 |
| COMPARATIVE EXAMPLE 4 | — | POLYIMIDE | 0 | 1.8 | 0/5 | 0/5 |
| COMPARATIVE EXAMPLE 5 | EPOXY RESIN | POLYIMIDE | 80 | 0.8 | 4/5 | 3/5 |
| COMPARATIVE EXAMPLE 6 | EPOXY RESIN | POLYIMIDE | 120 | 5.2 | 4/5 | 3/5 |

FIG.33

| | MOLD RESIN | PROTECTIVE TAPE | MOLD RESIN THICKNESS BEFORE PROCESSING (μm) | AVERAGE 90-DEGREE PEELING DURABILITY (N/cm) | JOINT-PART TENSILE-RELIABILITY TEST | |
|---|---|---|---|---|---|---|
| | | | | | 500 HOURS LATER (NUMBER OF GOOD SAMPLES/NUMBER OF SAMPLES) | 1000 HOURS LATER (NUMBER OF GOOD SAMPLES/NUMBER OF SAMPLES) |
| EXAMPLE 1 | EPOXY RESIN | POLYIMIDE | 60 | 6.5 | 20/20 | 20/20 |
| EXAMPLE 2 | EPOXY RESIN | POLYIMIDE | 80 | 10 | 20/20 | 20/20 |
| EXAMPLE 3 | EPOXY RESIN | POLYIMIDE | 100 | 8.2 | 20/20 | 20/20 |
| EXAMPLE 4 | EPOXY RESIN | POLYIMIDE | 120 | 7.4 | 20/20 | 20/20 |
| EXAMPLE 5 | ACRYLIC RESIN | POLYIMIDE | 80 | 13 | 20/20 | 19/20 |
| EXAMPLE 6 | POLYIMIDE | PEEK | 80 | 11 | 20/20 | 20/20 |
| EXAMPLE 7 | EPOXY RESIN | POLYIMIDE | 80 | 10 | 20/20 | 20/20 |
| EXAMPLE 8 | EPOXY RESIN | POLYIMIDE | 80 | 14 | 20/20 | 20/20 |
| COMPARATIVE EXAMPLE 1 | EPOXY RESIN | POLYIMIDE | 40 | 3.2 | 12/20 | 8/20 |
| COMPARATIVE EXAMPLE 2 | EPOXY RESIN | POLYIMIDE | 140 | 3.8 | 18/20 | 12/20 |
| COMPARATIVE EXAMPLE 3 | EPOXY RESIN | — | 80 | 3.3 | 8/20 | 2/20 |
| COMPARATIVE EXAMPLE 4 | — | POLYIMIDE | 0 | 1.8 | 0/20 | 0/20 |
| COMPARATIVE EXAMPLE 5 | EPOXY RESIN | POLYIMIDE | 80 | 3.9 | 17/20 | 11/20 |
| COMPARATIVE EXAMPLE 6 | EPOXY RESIN | POLYIMIDE | 120 | 4.5 | 18/20 | 11/20 |

FIG.34

| | MOLD RESIN | PROTECTIVE TAPE | MOLD RESIN THICKNESS BEFORE PROCESSING (μm) | ADHESION STRENGTH (N/cm) | JOINT-PART REPEATED-BENDING RELIABILITY TEST | |
|---|---|---|---|---|---|---|
| | | | | | 500 HOURS LATER (NUMBER OF GOOD SAMPLES/NUMBER OF SAMPLES) | 1000 HOURS LATER (NUMBER OF GOOD SAMPLES/NUMBER OF SAMPLES) |
| EXAMPLE 1 | EPOXY RESIN | POLYIMIDE | 60 | 10 | 20/20 | 20/20 |
| EXAMPLE 2 | EPOXY RESIN | POLYIMIDE | 80 | 16 | 20/20 | 20/20 |
| EXAMPLE 3 | EPOXY RESIN | POLYIMIDE | 100 | 12 | 20/20 | 20/20 |
| EXAMPLE 4 | EPOXY RESIN | POLYIMIDE | 120 | 10 | 20/20 | 20/20 |
| EXAMPLE 5 | ACRYLIC RESIN | POLYIMIDE | 80 | 13 | 20/20 | 18/20 |
| EXAMPLE 6 | POLYIMIDE | PEEK | 80 | 11 | 20/20 | 20/20 |
| EXAMPLE 7 | EPOXY RESIN | POLYIMIDE | 80 | 9.5 | 20/20 | 20/20 |
| EXAMPLE 8 | EPOXY RESIN | POLYIMIDE | 80 | 12 | 20/20 | 20/20 |
| COMPARATIVE EXAMPLE 1 | EPOXY RESIN | POLYIMIDE | 40 | 3.8 | 12/20 | 6/20 |
| COMPARATIVE EXAMPLE 2 | EPOXY RESIN | POLYIMIDE | 140 | 4.2 | 18/20 | 8/20 |
| COMPARATIVE EXAMPLE 3 | EPOXY RESIN | — | 80 | 3.2 | 4/20 | 1/20 |
| COMPARATIVE EXAMPLE 4 | — | POLYIMIDE | 0 | 2.3 | 0/20 | 0/20 |
| COMPARATIVE EXAMPLE 5 | EPOXY RESIN | POLYIMIDE | 80 | 4.0 | 12/20 | 5/20 |
| COMPARATIVE EXAMPLE 6 | EPOXY RESIN | POLYIMIDE | 120 | 5.8 | 18/20 | 9/20 |

LIGHT EMITTING DEVICE, METHOD OF MANUFACTURING LIGHT EMITTING DEVICE, AND LIGHTING TOOL FOR VEHICLE

CROSS REFERENCE TO RELATED APPLICATIONS

This application is a continuation of U.S. Ser. No. 16/713,256, filed Dec. 13, 2019, which claims the benefit of priority from Japanese Patent Application No. 2018-235711, filed Dec. 17, 2018, and Japanese Patent Application No. 2019-150652, filed on Aug. 20, 2019; the entireties of which are incorporated herein by reference.

FIELD OF THE INVENTION

Embodiments of the present invention relate to a light emitting device, a method of manufacturing a light emitting device, and a lighting tool for vehicles.

BACKGROUND OF THE INVENTION

A light emitting device that is flexible and that has a light emitting part and external wiring to be connected to the light emitting part, has been disclosed.

The light emitting part of the light emitting device has a pair of insulated substrates that are translucent and flexible, a plurality of light emitting elements that are arrayed between the pair of insulated substrates, an internal wiring pattern that is formed on an inner surface of at least one of the pair of insulated substrates, and that is connected to the light emitting elements, and a resin layer that is provided between the pair of insulated substrates, and that is translucent and insulated. Also, an end part of the external wiring is branched into a plurality of wirings having a line width narrower than the line width of the internal wiring. Furthermore, an end part of the internal wiring pattern is joined to the end part of the external wiring, which is branched into a plurality of wirings, by using an anisotropic conductive adhesive, at an end part of the insulated substrates.

The light emitting device described above has problems, such as dielectric breakdown being produced in the joint part of the light emitting part and the external wiring due to migration, high susceptibility to deterioration over time, and so on.

BRIEF DESCRIPTION OF THE DRAWINGS

FIG. 14 is a diagram showing a table that shows test results of samples;
FIG. 18 is an exploded perspective view of the light emitting device;
FIG. 24 is a diagram for illustrating the method of manufacturing the light emitting device;
FIG. 25 is a diagram for illustrating the method of manufacturing the light emitting device;
FIG. 26 is a diagram for illustrating the method of manufacturing the light emitting device;
FIG. 27 is a diagram showing results of a cross-sectional void observation test and an infiltration search test;
FIG. 33 is a diagram showing evaluation results of a Joint-Part Tensile-Reliability test;
FIG. 34 is a diagram showing evaluation results of the joint-part repeated bending reliability test.

DETAILED DESCRIPTION OF THE INVENTION

The light emitting device according to the present embodiment has a light emitting panel, a flexible wiring substrate, a mold resin, and a protective tape. The light emitting panel has a first substrate that is transparent to light, a plurality of conductor patterns that are formed on a surface of the first substrate, a plurality of light emitting elements that are connected to any of the plurality of conductor patterns, and a resin layer that holds the light emitting elements on the first substrate. The flexible wiring substrate has a circuit pattern that is electrically connected to an exposed part of the conductor patterns, exposing from an end part of the resin layer. The mold resin covers the exposed part of the conductor patterns and the exposed part of the circuit pattern, and also covers an end part of the light emitting panel and an end part of the flexible wiring substrate. The protective tape covers the mold resin, and is wound around the joint part of the light emitting panel and the flexible wiring substrate.

First Embodiment

Now, a first embodiment of the present invention will be described below with reference to the accompanying drawings. The following description will use an XYZ coordinate system, consisting of an X axis, a Y axis and a Z axis that are orthogonal to each other.

Figure 1:
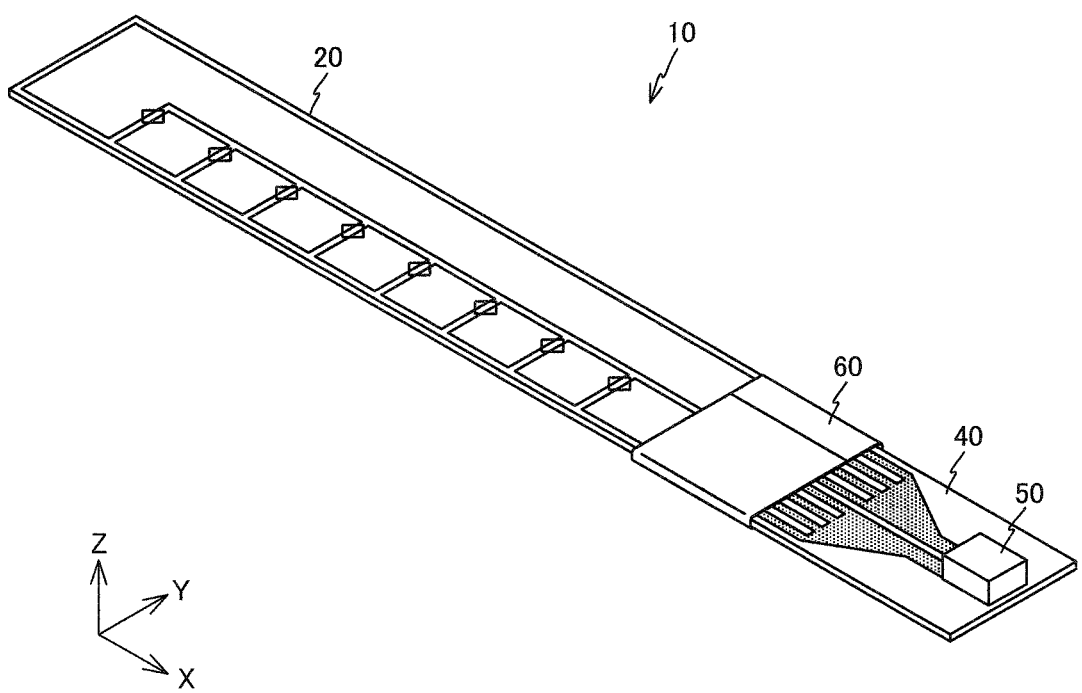
FIG. 1 is a perspective view of a light emitting device according to a first embodiment.
Figure 2:
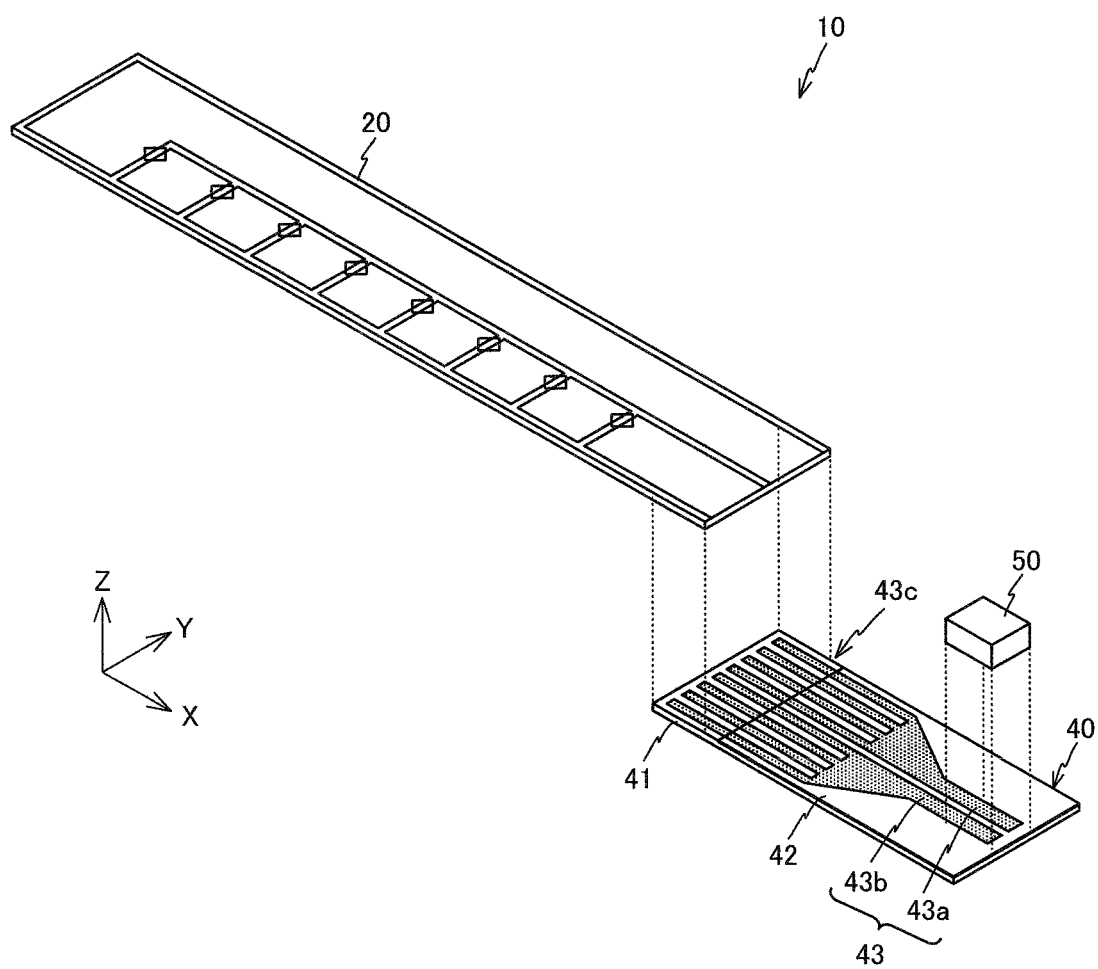
FIG. 2 is an exploded perspective view of the light emitting device.

FIG. 1 is a perspective view of a light emitting device 10 according to the present embodiment. Also, FIG. 2 is an exploded perspective view of the light emitting device 10. As can be seen by referring to FIG. 1 and FIG. 2, the light emitting device 10 has a light emitting panel 20, a flexible wiring substrate 40 that is connected to the light emitting panel 20, and a connector 50 that is mounted on the flexible wiring substrate 40. A protective tape 60 is bonded to the joint part of the light emitting panel 20 and the flexible wiring substrate 40.

Figure 3:
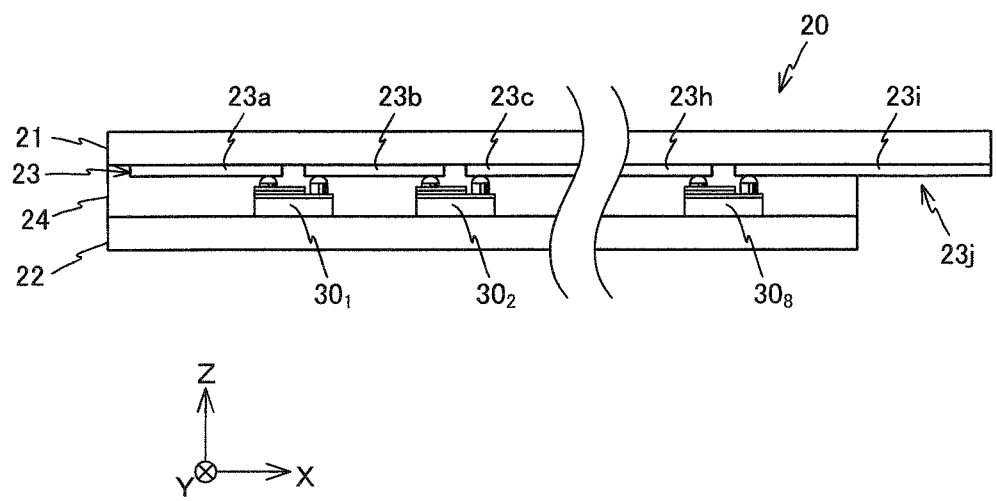
FIG. 3 is a side view of a light emitting panel.

FIG. 3 is a side view of the light emitting panel 20. As shown in FIG. 3, the light emitting panel 20 has a pair of substrates 21 and 22, a resin layer 24 that is formed between the substrates 21 and 22, and eight light emitting elements $30_1$ to $30_8$ that are arranged inside the resin layer 24.

The substrates 21 and 22 are rectangular substrates, whose longitudinal direction runs along the X-axis direction. The substrate 21 is a film-like member that is approximately 50 to 300-μm thick. The substrates 21 and 22 are transparent to visible light. The total luminous transmittance of the substrates 21 and 22 is preferably about 5 to 95%. Note that the total luminous transmittance refers to the total luminous transmittance measured in conformity with the Japanese Industrial Standard JISK7375: 2008.

Also, the substrates 21 and 22 are flexible, and their bending modulus of elasticity is 0 to 320 kgf/mm², approximately. Note that the bending modulus of elasticity is a value that is measured by a method in conformity with ISO178 (JIS K7171: 2008).

As for the materials for the substrates 21 and 22, polyethylene terephthalate (PET), polyethylene naphthalate (PEN), polycarbonate (PC), polyethylene succinate (PES), arton (ARTON), acrylic resin and so forth may be used.

A conductor layer 23, approximately 0.05 μm to 2-μm thick, is formed in the lower surface of the substrate 21 (the surface on the −Z side in FIG. 3) between the pair of substrates 21 and 22.

Figure 4:
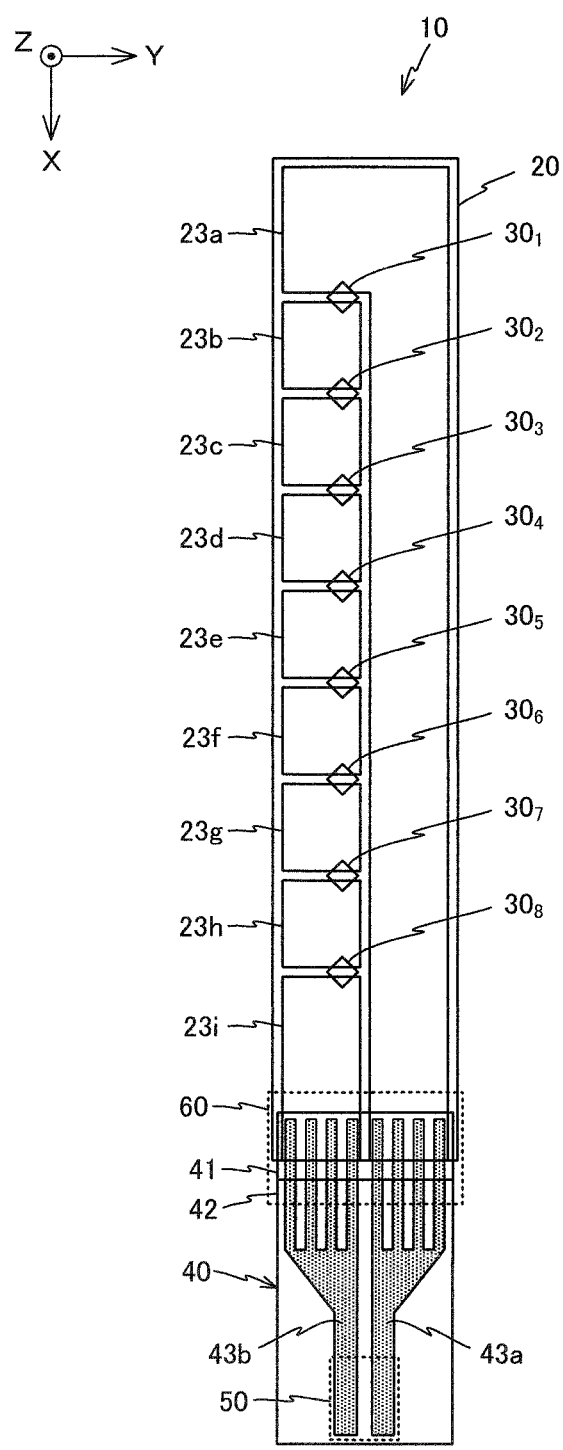
FIG. 4 is a plan view of the light emitting device.

FIG. 4 is a plan view of the light emitting device 10. As can be seen by referring to FIG. 4, the conductor layer 23 is comprised of an L-shaped conductor pattern 23a, which is formed along the +Y-side outer edge of the substrate 21, and a plurality of rectangular conductor patterns 23b to 23i, which are arrayed along the −Y-side outer edge of the substrate 21. The conductor patterns 23a to 23i are made of metallic materials such as copper (Cu), silver (Ag) and so on. In the light emitting device 10, the distances among the conductor patterns 23a to 23i are approximately 100 μm or less. The conductor patterns 23a to 23i are in a mesh pattern comprised of a plurality of line patterns that are orthogonal to each other. The line width of the line patterns is approximately 5 μm, and the array pitch is approximately 150 μm.

The conductor patterns constituting the conductor layer 23 are disclosed in detail in US Patent Application Publication No. 2016/0276322 (WO/2015/083366). Its content is incorporated herein by reference.

In the light emitting device 10, the substrate 22 is shorter than the substrate 21 in the X-axis direction. Consequently, as can be seen by referring to FIG. 3, an exposed part 23j is formed so that the +X-side end of the conductor pattern 23a and the conductor pattern 23i constituting the conductor layer 23 is exposed.

As shown in FIG. 3, the resin layer 24 is an insulator that is formed between the substrate 21 and the substrate 22. The resin layer 24 is approximately 50 to 100-μm thick, and made of, for example, a translucent epoxy thermosetting resin. The resin layer 24 preferably has a transmittance of 5% or higher, and is made of materials that are primarily composed of thermosetting resins. The materials to constitute the resin layer 24 may contain other resin components or the like if necessary. Thermosetting resins that are known include epoxy resin, acrylic resin, styrene resin, ester resin, urethane resin, melamine resin, phenol resin, unsaturated polyester resin, diallyl phthalate resin, and so forth.

Also, the resin layer 24 may be made of thermoplastic resins. The thermoplastic resins that are known include polypropylene resin, polyethylene resin, polyvinyl chloride resin, acrylic resin, Teflon resin (registered trademark), polycarbonate resin, acrylonitrile butadiene styrene resin, polyamideimide resin, and so forth.

The resin layer 24 according to the present embodiment is also disclosed in detail in US Patent Application Publication No. 2016/0155913 (WO2014156159). Its content is incorporated herein by reference. Furthermore, the physical properties of the resin layer 24 such as mechanical loss tangent are disclosed in detail in Japanese Patent Application No. 2018-164946. Its content is incorporated herein by reference.

Figure 5:
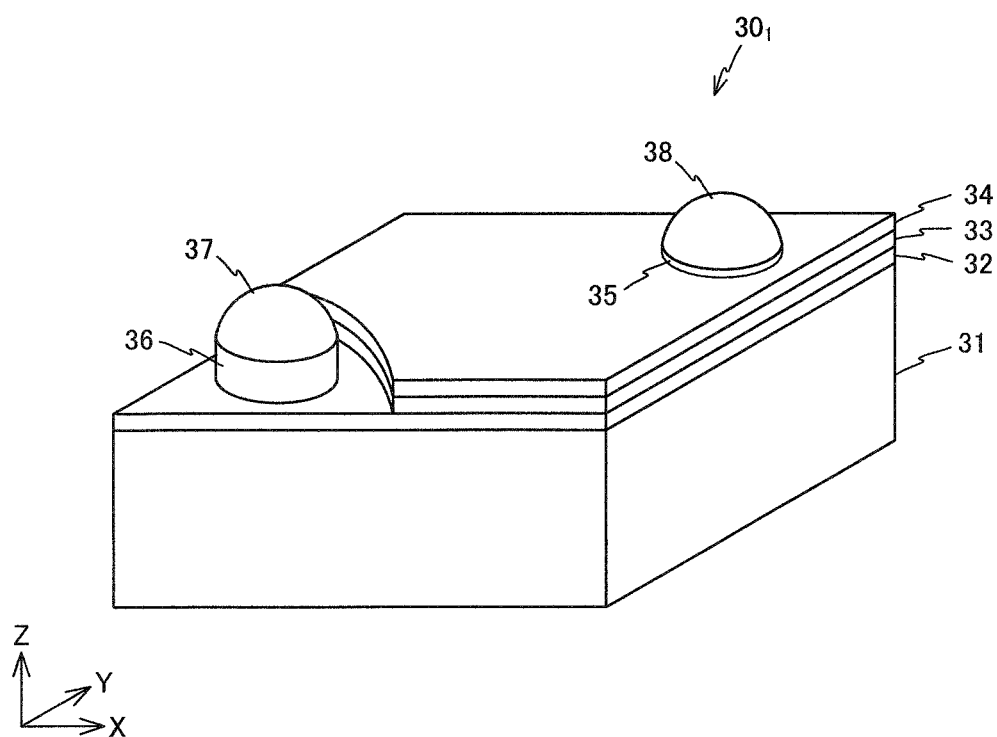
FIG. 5 is a perspective view of a light emitting element.

The light emitting element $30_1$ is a square LED chip. As shown in FIG. 5, the light emitting element $30_1$ is an LED chip of a four-layer structure, comprised of a base substrate 31, an N-type semiconductor layer 32, an active layer 33, and a P-type semiconductor layer 34. A voltage of approximately 2.5 V is applied to the light emitting element $30_1$.

The base substrate 31 is a square plate-like semiconductor substrate that is comprised of GaAs, Si, GaP, and the like. The N-type semiconductor layer 32 having the same shape as the base substrate 31 is formed on the upper surface of the base substrate 31. Then, the active layer 33 and the P-type semiconductor layer 34 are stacked, in order, on the upper surface of the N-type semiconductor layer 32. The active layer 33 and the P-type semiconductor layer 34 stacked on the N-type semiconductor layer 32 have a notch formed in their −Y-side and −X-side corner portion, and the surface of the N-type semiconductor layer 32 is exposed from the notch. The N-type semiconductor layer and the P-type semiconductor layer may be reversed.

In the portion of the N-type semiconductor layer 32 that is exposed from the active layer 33 and the P-type semiconductor layer 34, a pad 36, which is electrically connected with the N-type semiconductor layer 32, is formed. In addition, an electrode 35, which is electrically connected with the P-type semiconductor layer 34, is formed in the +X-side and +Y-side corner portion of the P-type semiconductor layer 34. The electrodes 35 and 36 are made of copper (Cu) and gold (Au), and bumps 37 and 38 are formed on their upper surfaces. The bumps 37 and 38 are made of solder, and shaped like a hemisphere. Metal bumps of gold (Au), a gold alloy, and so forth may be used instead of solder bumps. In the light emitting element 301, the bump 37 functions as a cathode electrode, and the bump 38 functions as an anode electrode.

The light emitting element $30_1$ configured as described above is, as shown in FIG. 6, arranged between the conductor patterns 23a and 23b, the bump 37 is connected to the conductor pattern 23a, and the bump 38 is connected to the conductor pattern 23b.

The N-type semiconductor layer 32 of the light emitting element $30_1$ faces only the conductor pattern 23a where the bump 37 is connected, and the P-type semiconductor layer 34 of the light emitting element $30_1$ faces both the conductor pattern 23a where the bump 37 is connected, and the conductor pattern 23b where the bump 38 is connected.

Other light emitting elements $30_2$ to $30_8$ also have the same configuration as the light emitting element $30_1$. Then, the light emitting element $30_2$ is arranged between conductor patterns 23b and 23c, and bumps 37 and 38 are respectively connected to the conductor patterns 23b and 23c. Following this in a similar fashion, the light emitting element 303 is arranged over conductor patterns 23c and 23d. The light emitting element $30_4$ is arranged over conductor patterns 23d and 23e. The light emitting element $30_5$ is arranged over conductor patterns 23e and 23f. The light emitting element $30_6$ is arranged over conductor patterns 23f and 23g. The light emitting element $30_7$ is arranged over conductor patterns 23g and 23h. The light emitting element $30_8$ is arranged over conductor patterns 23h and 23i. By this means, the conductor patterns 23a to 23i and the light emitting elements $30_1$ to $30_8$ are connected in series. On the light emitting panel 20, the light emitting elements 30 are arranged at approximately 10-mm intervals.

The bumps 37 and 38 to be provided in the light emitting elements 30 are also disclosed in detail in US Patent Application Publication No. 2016/0276561 (WO/2015/083365). Its content is incorporated herein by reference. Also, the electrical connections between the bumps 37 and 38 and the conductor layer 23 in the light emitting device are disclosed in detail in Japanese Patent Application No. 2018-16165. Its content is incorporated herein by reference.

Figure 7:
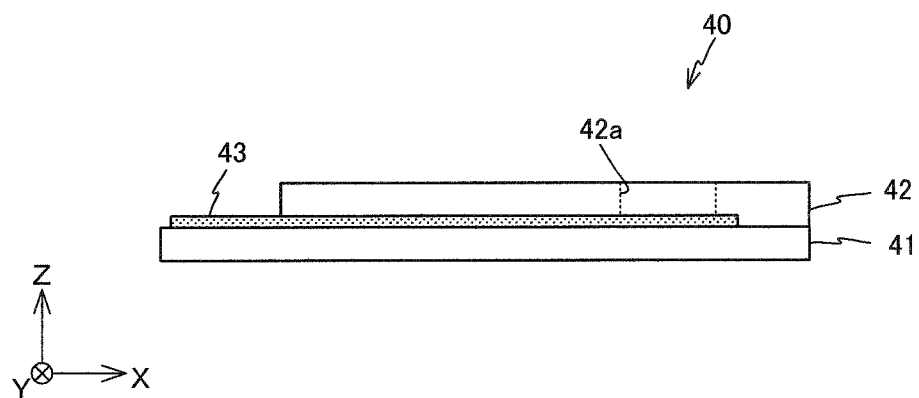
FIG. 7 is a side view of a flexible cable.

FIG. 7 is a side view of the flexible wiring substrate 40. The flexible wiring substrate 40 is approximately 80-μm thick, and comprised of a base material 41, a conductor layer 43 and a coverlay 42.

The base material 41 is a rectangular member, whose longitudinal direction runs along the X-axis direction as shown in FIG. 2. This base material 41 is made of polyimide, for example, and a conductor layer 43 is formed on its upper surface. The conductor layer 43 is formed by patterning a copper foil that is stuck on the upper surface of polyimide. With the present embodiment, the conductor layer 43 is formed with two circuit patterns 43a and 43b.

The circuit patterns 43a and 43b are formed over the base material 41, from the −X-side end to the +X-side end. In the circuit patterns 43a and 43b, the −X-side end part is branched into a plurality of parts, and formed in a tapered shape so that the width of the +X-side end part narrows towards the +X direction.

As shown in FIG. 7, the conductor layer 43 formed on the upper surface of the base material 41 is covered with the coverlay 42 that is bonded by vacuum thermo-compression. This coverlay 42 is shorter than the base material 41 in the X-axis direction. Consequently, the −X-side end parts of the circuit patterns 43a and 43b constituting the conductor layer 43 are exposed. Also, an opening part 42a is provided in the coverlay 42, and the +X-side end parts of the circuit patterns 43a and 43b are exposed from this opening part 42a.

Figure 8:
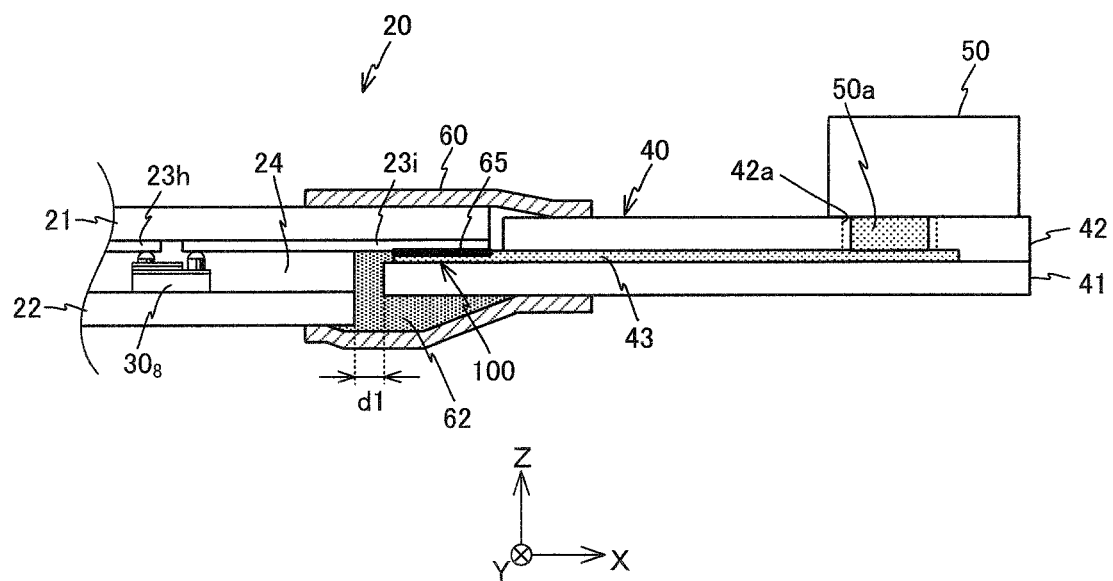
FIG. 8 is a diagram showing a joint part of the light emitting panel and the flexible cable.

As can be seen by referring to FIG. 4 and FIG. 8, the flexible wiring substrate 40 configured as described above is bonded to the light emitting panel 20 in a state in which parts of the circuit patterns 43a and 43b that are exposed from the coverlay 42 are in contact with the +X-side end parts of the conductor patterns 23a and 23i of the light emitting panel 20. For example, an anisotropic conductive film (ACF) is used to bond the circuit patterns 43a and 43b and the conductor patterns 23a and 23i.

The flexible wiring substrate 40 is disclosed in detail in US Patent Application Publication No. 2016/0276321 (WO/2015/083364). Its content is incorporated herein by reference.

As shown in FIG. 8, the gap between the resin layer 24 and the substrate 22 that constitute the light emitting panel 20 and the base material 41 that constitutes the flexible wiring substrate 40 is filled with a mold resin 62. The width d1 (the size in the X-axis direction) of the gap is approximately 2 mm. The mold resin 62 is a resin to contain, as main components, thermoplastic EVA (Ethylene-Vinyl Acetate) resin, polyolefin, synthetic rubber, polyamide, polyester, polyurethane, and so forth. The mold resin 62 is in close contact with the side surfaces of the resin layer 24, the substrate 22 and the base material 41, and the conductor layer 23 (conductor patterns 23a and 23i), without a gap.

The protective tape 60 is stuck around the joint part 100 of the light emitting panel 20 and the flexible wiring substrate 40. As shown in FIG. 1, the protective tape 60 is wound around the light emitting panel 20 and the flexible wiring substrate 40. The protective tape 60 is made of a material that is excellent in heat resistance and insulation, such as polyimide.

As shown in FIG. 2, a connector 50 is a rectangular parallelepiped component, and is connected with a cable that is routed from a DC power source. The connector 50 is mounted on the upper surface of the +X-side end part of the flexible wiring substrate 40. When the connector 50 is mounted on the flexible wiring substrate 40, as shown in FIG. 8, a pair of terminals 50a of the connector 50 are respectively connected with the circuit patterns 43a and 43b constituting the conductor layer 43 of the flexible wiring substrate 40, through the opening part 42a provided in the coverlay 42.

Figure 9:
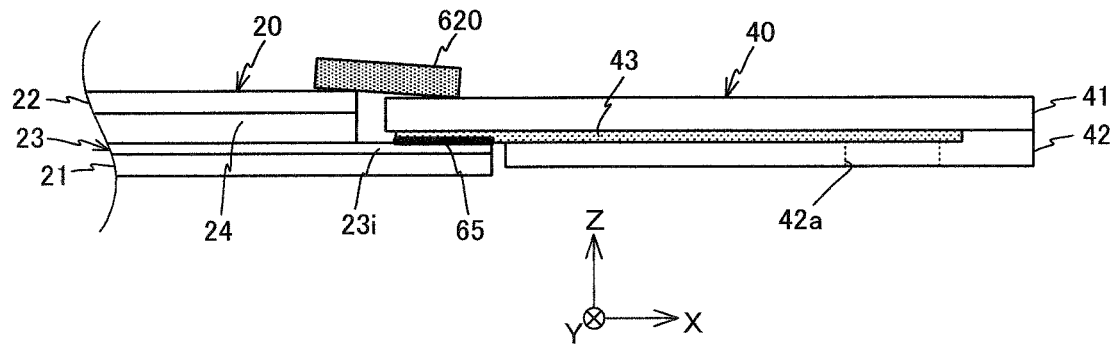
FIG. 9 is a diagram for illustrating a method of manufacturing the light emitting device.

Next, a method for connecting the above-described light emitting panel 20 and flexible wiring substrate 40 will be described. When connecting the light emitting panel 20 and the flexible wiring substrate 40, first, as shown in FIG. 9, the conductor layer 23 that constitutes the light emitting panel 20, and the conductor layer 43 of the flexible wiring substrate 40, are connected using an anisotropic conductive film 65. As can be seen by referring to FIG. 2, when connecting the conductor layers 23 and 43, the anisotropic conductive film 65 is provided in the base material 41 exposing from the coverlay 42 and in the exposed part 43c of the conductor layer 43. The exposed part 23j of the conductor layer 23 and the exposed part 43c of the conductor layer 43 are electrically connected by the anisotropic conductive film 65.

Figure 10:
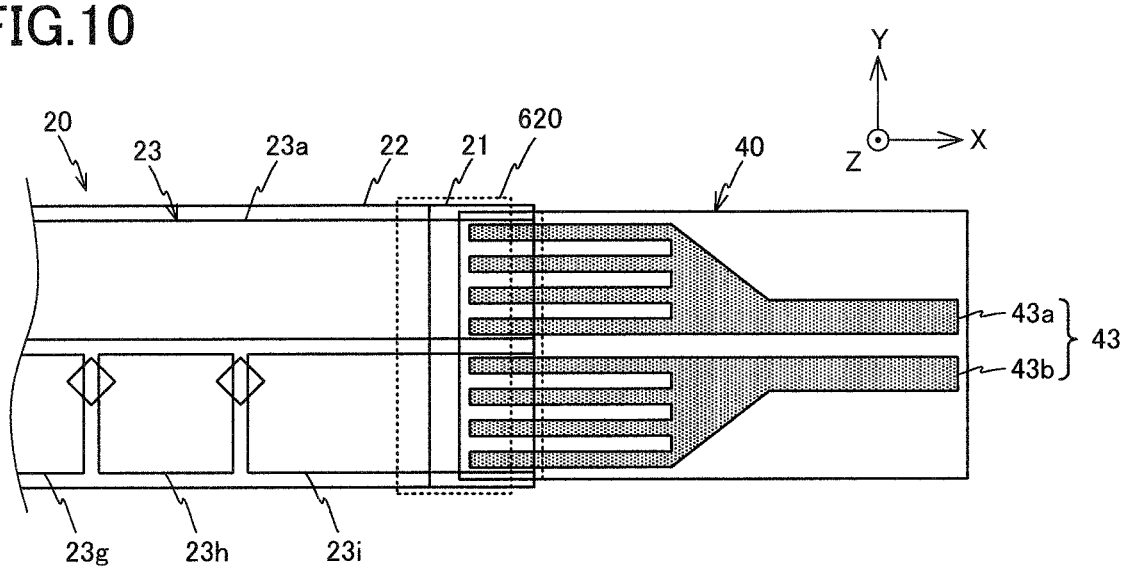
FIG. 10 is a diagram for illustrating the method of manufacturing the light emitting device.

Next, a hot-melt resin 620, which serves as a resin material, is arranged so as to overlap the boundary between the light emitting panel 20 and the flexible wiring substrate 40. To be more specific, the hot-melt resin 620 is arranged over the substrate 22 and the resin layer 24 of the light emitting panel 20, and the base material 41 of the flexible wiring substrate 40. As shown in FIG. 10, the hot-melt resin 620 is shaped into a rectangle, whose longitudinal direction runs along the Y-axis direction. The dimension of the hot-melt resin 620 in the Y-axis direction is equivalent to the width (the dimension in the Y-axis direction) of the light emitting panel 20.

Figure 11:
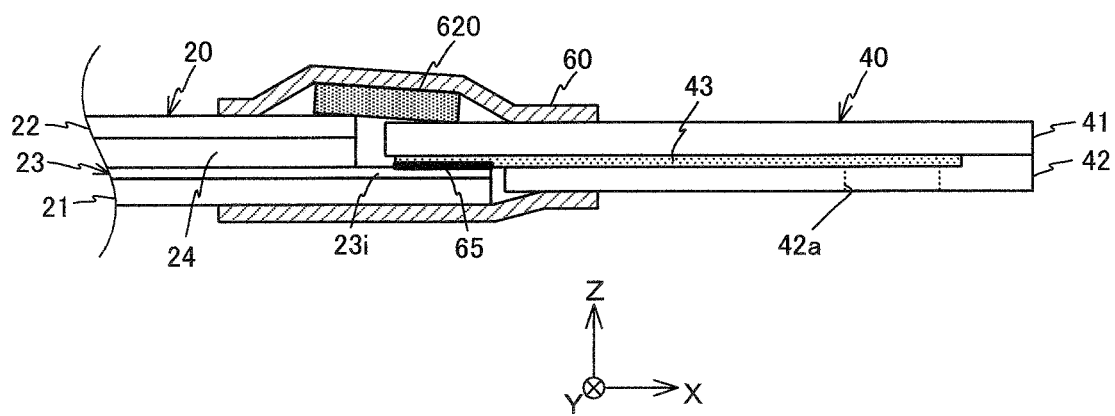
FIG. 11 is a diagram for illustrating the method of manufacturing the light emitting device.

Next, as shown in FIG. 11, the protective tape 60 is wound around the joint part of the light emitting panel 20 and the flexible substrate, and the hot-melt resin 620, to bond these. In this state, the −X-side end part of the protective tape 60 is bonded to the light emitting panel 20, and the +X-side end part is bonded to the flexible wiring substrate 40. Therefore, a state is assumed here in which the hot-melt resin 620 is arranged in the space defined by the protective tape 60, the light emitting panel 20 and the flexible substrate.

Next, the hot-melt resin 620 is bonded by thermo-compression to the light emitting panel 20 and the flexible wiring substrate 40, together with the protective tape 60. By this means, as shown in FIG. 8, the hot-melt resin 620 serves as the mold resin 62 to fill between the light emitting panel 20 and the flexible wiring substrate 40 without a gap. The mold resin 62 is in close contact, without a gap, with the side surfaces of the resin layer 24, the substrate 22 and the base material 41, and with the conductor layers 23 (conductor patterns 23a and 23i) that is exposed.

Next, the connector 50 is mounted on the flexible wiring substrate 40. By this means, the light emitting device 10 shown in FIG. 1 is completed.

With the light emitting device 10 configured as described above, when a DC voltage is applied to the circuit patterns 43a and 43b shown in FIG. 4 via the connector 50, the light emitting elements 30 constituting the light emitting panel 20 emit light. The rated voltage of the light emitting elements 30 is approximately 2.5 V, so that in the light emitting device 10, a voltage of approximately 20 V is applied to the circuit patterns 43a and 43b.

As described above, with the present embodiment, for example, as shown in FIG. 9, the hot-melt resin 620 is arranged so as to overlap the boundary between the light emitting panel 20 and the flexible wiring substrate 40. Then, along with the protective tape 60 wrapped around and bonded to the joint part of the light emitting panel 20 and the flexible substrate, the hot-melt resin 620 is bonded by thermo-compression to the light emitting panel 20 and the flexible wiring substrate 40, so that the mold resin 62 to fill between the light emitting panel 20 and the flexible wiring substrate 40 can be formed.

Therefore, the mold resin 62 can be formed easily and in a short time, compared to cases in which the mold resin 62 is formed by, for example, potting resin, spreading resin using a dispenser, and so forth. In addition, with the present embodiment, the process of forming the mold resin 62 can be carried out in parallel with the therm-compression bonding process of the protective tape 60. Therefore, the process of manufacturing the light emitting device 10 can be simplified, and, consequently, the cost for manufacturing the light emitting device 10 can be reduced.

With the present embodiment, the mold resin 62 is filled between the light emitting panel 20 and the flexible wiring substrate 40, which are connected with each other. This mold resin 62 is in close contact, without a gap, with the side surfaces of the resin layer 24, the substrate 22, and the base material 41, and with the conductor layers 23 (conductor patterns 23a and 23i) that is exposed. Therefore, the exposed conductor layer 23 is not exposed to outside air or condensation, so that the corrosion of the conductor layer 23 can be reduced. Consequently, the reliability of the light emitting device 10 can be improved.

For example, after the anisotropic conductive film 65 is used for the light emitting panel 20 and the flexible wiring substrate 40, it may be possible to use the protective tape 60 alone, to reinforce the joint part, or to take measures against moisture. However, it is difficult to sufficiently seal the gap between the light emitting panel 20 and the flexible wiring substrate 40, connected with each other, with the protective tape 60. Consequently, migration-induced dielectric breakdown, deterioration of the joint part over time, and so forth cannot be reduced sufficiently. With the present embodiment, the mold resin 62 is filled between the light emitting panel 20 and the flexible wiring substrate, without a gap, so that migration-induced dielectric breakdown, deterioration of the joint part over time, and so forth can be reduced sufficiently.

Figure 12:
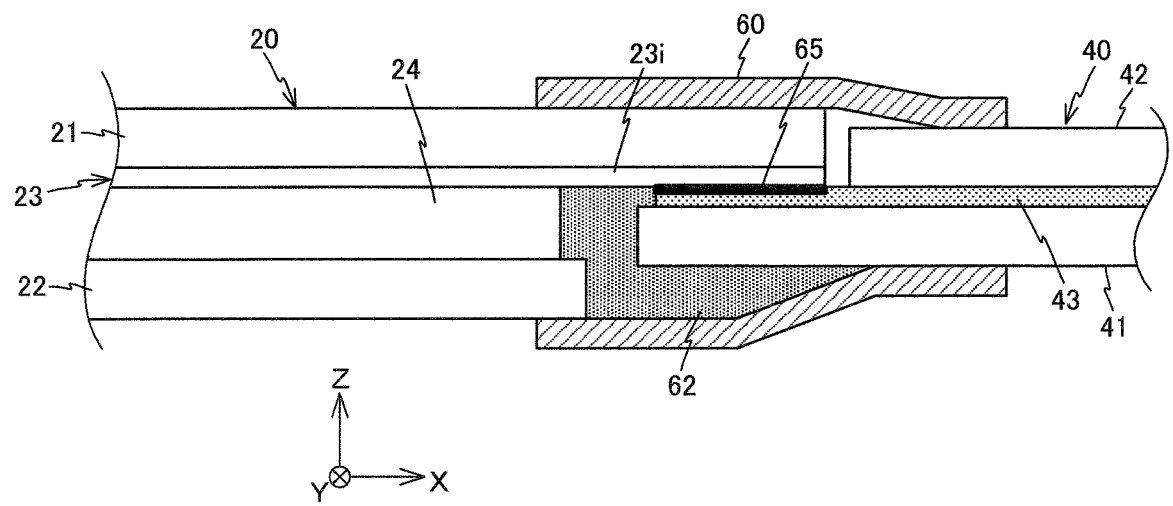
FIG. 12 is a diagram for illustrating positional relationships between a resin layer and substrates.
Figure 13:
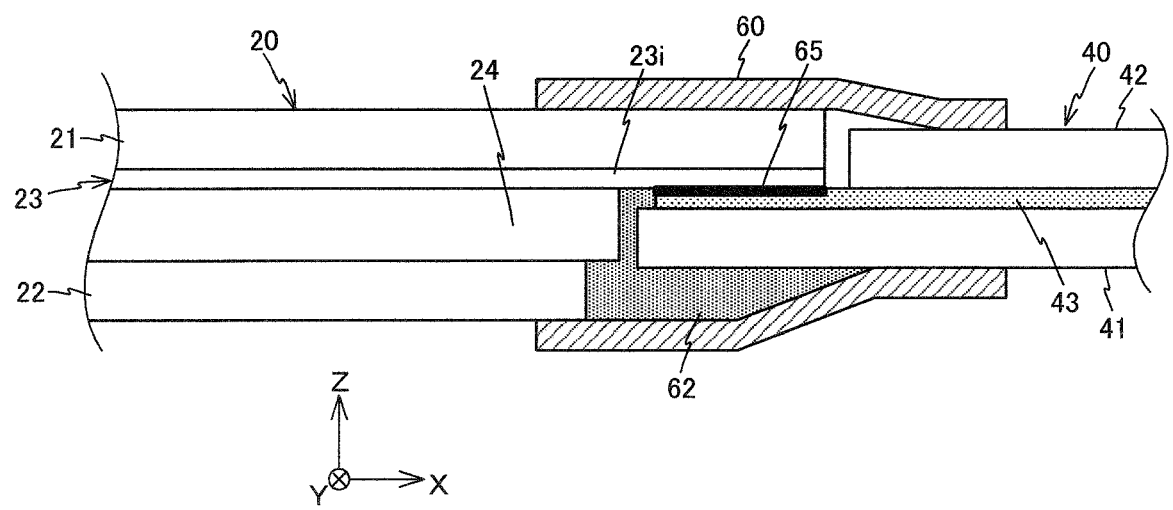
FIG. 13 is a diagram for illustrating positional relationships between the resin layer and the substrates.

For example, with the light emitting device 10, when the +X-side end of the substrate 22 protrudes beyond the resin layer 24 as shown in FIG. 12, or the case where the resin layer 24 protrudes beyond the +X-side end of the substrate 22 as shown in FIG. 13 might occur.

With the present embodiment, in either case shown in FIG. 12 or FIG. 13, the mold resin 62 is formed so as to be in close contact with the side surface of the resin layer 24 and the side surface of the substrate 21. Consequently, the conductor layer 23 that is exposed from between the substrate 22 of the light emitting panel 20 and the base material 41 of the flexible wiring substrate 40 can be sealed hermetically using the mold resin 62. Therefore, the dielectric breakdown of the conductor layer 23 due to migration, the deterioration of the joint part over time, and so forth can be reduced sufficiently.

In particular, as shown in FIG. 12, when the substrate 22 protrudes like an eave, a groove to serve as a passage for the water produced by condensation is formed. However, with the present embodiment, the mold resin 62 can prevent water from seeping in through the above passage, and improve the reliability of the light emitting device 10.

The mass flow rate (MFR) of the mold resin 62 that constitutes the light emitting device 10 is preferably 3.0 g/10 min or more and 12.3 g/10 min or less. The reason will be described below.

The present inventors have prepared ten types of samples A to 3 for the light emitting device 10 shown in FIG. 1, and tested them. The MFR of the mold resin 62 shown in FIG. 8 varies among all of samples A to J. Also, in samples A to 3, the substrates 21 and 22 are 100-μm thick, the resin layer 24 is 60-μm thick, and the flexible wiring substrate 40 is 80-μm thick. FIG. 14 is an example of a table showing the test results of samples A to J. As shown in FIG. 14, the MFRs of samples A to J are 1.5, 2.0, 3.0, 5.2, 7.2, 9.5, 12.3, 13.0, 30.0 and 50.0 g/10 min, respectively. Ten pieces of each of these samples A to 3 were prepared.

The "normal temperature" section in the table shows the number of samples, in each of samples A to J, with which lighting was confirmed in a room-temperature environment (25 to 30° C.). Referring to the numerical values in the section of normal temperature, the denominator indicates the number of each type of samples, and the numerator indicates the number of samples that demonstrated defects such as lighting failures. For example, "0/10" indicates that the number of samples that demonstrated defects among ten samples was zero. As shown in the table, in an environment where the temperature is indoor temperature (25 to 30° C.), it was confirmed that ten samples of each of ten types of samples A to J were normally lit.

Then, for each of samples A to 3, a pressure cooker test (PCT) and a warm-water immersion test were conducted. PCT is a test to apply electricity to each of samples A to 3 for 24 hours in an environment in which the temperature is 121° C. and the humidity is 100%. Furthermore, the warm-water immersion test is a test to apply electricity to each of samples A to 3 for 24 hours in 85° C. warm water.

As shown in the table of FIG. 14, in the PCT and the warm-water immersion test, the number of samples C to G with which lighting failure occurred was zero. Meanwhile, with samples A, B, I and J, there were samples with which lighting failure occurred, in both the PCT and the warm-water immersion tests. In addition, sample H had a sample with which lighting failure occurred in the warm-water immersion test. Therefore, when the MFR is 3.0 or more and 12.3 or less as with samples C to G, it is possible to think that water is prevented from seeping in the joint part of the light emitting panel 20 of the light emitting device 10 and the flexible wiring substrate 40. Accordingly, the mass flow rate (MFR) of the mold resin 62 is preferably 3.0 g/10 min or more and 12.3 g/10 min or less.

Figure 15:
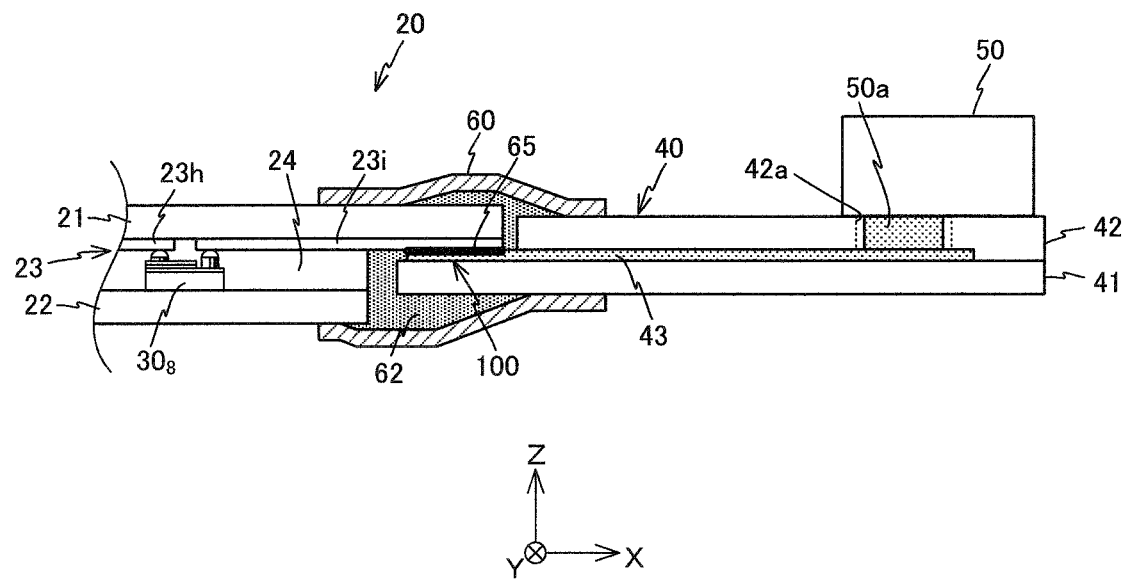
FIG. 15 is a diagram for illustrating a light emitting device according to a variation.

Now, although an embodiment of the present invention has been described above, the present invention is by no means limited to the embodiment described above. For example, a case has been described with the above embodiment where, as shown in FIG. 8, the gap between the resin layer 24 and the substrate 22 that constitute the light emitting panel 20 and the base material 41 that constitutes the flexible wiring substrate 40 is filled with the mold resin 62. This is by no means limiting, and, for example, as shown in FIG. 15, the gap between the substrate 21 that constitutes the light emitting panel 20 and the coverlay 42 that constitutes the flexible wiring substrate 40 may be filled with the mold resin 62. By this means, the two boundaries between the light emitting panel 20 and the flexible wiring substrate 40 are all sealed with the mold resin 62. Consequently, migration-induced dielectric breakdown, deterioration of the joint part over time, and so forth can be reduced sufficiently.

Figure 16:
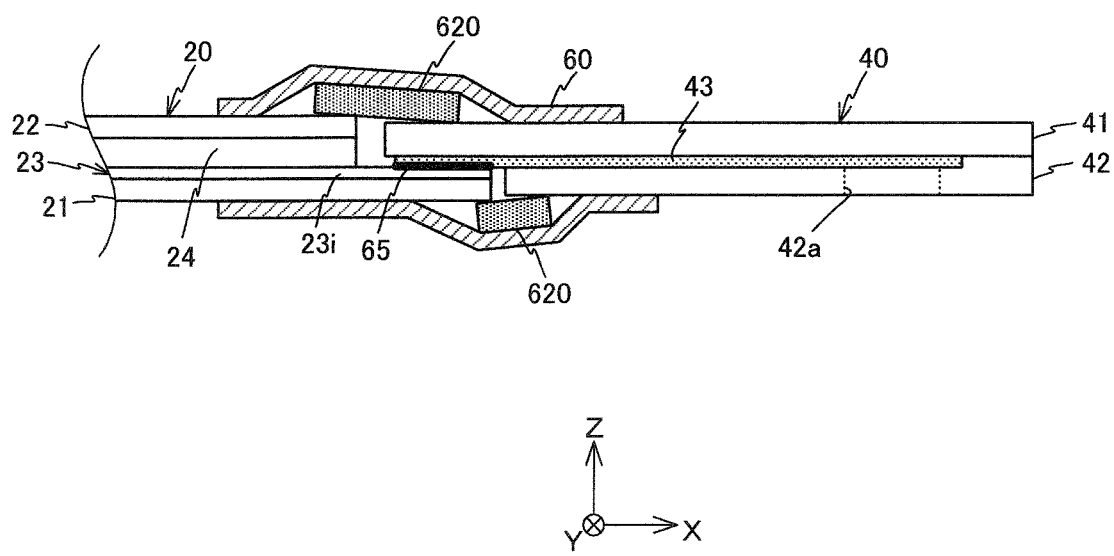
FIG. 16 is a diagram for illustrating a method of manufacturing the light emitting device according to the variation.

As can be seen by referring to FIG. 16, to manufacture the above-described light emitting device 10, first, the conductor layer 23 that constitutes the light emitting panel 20 and the conductor layer 43 of the flexible wiring substrate 40 are connected using the anisotropic conductive film 65. Next, a hot-melt resin 620, which serves as a resin material, is arranged so as to overlap the boundary between the two of the light emitting panel 20 and the flexible wiring substrate 40. To be more specific, a hot-melt resin 620 is arranged over the substrate 22 and the resin layer 24 of the light emitting panel 20, and the base material 41 of the flexible wiring substrate 40. Similarly, the hot-melt resin 620 is arranged over the substrate 21 that constitutes the light emitting panel 20 and the coverlay 42 that constitutes the flexible wiring substrate 40. Next, the protective tape 60 is wound around the joint part of the light emitting panel 20 and the flexible substrate and the hot-melt resin 620, to bond these. In this state, the −X-side end part of the protective tape 60 is bonded to the light emitting panel 20, and the +X-side end part is bonded to the flexible wiring substrate 40. Therefore, a state is assumed here in which two hot-melt resins 620 are arranged in the space defined by the protective tape 60, the light emitting panel 20 and the flexible substrate.

Next, the two hot-melt resins 620 are bonded by thermocompression to the light emitting panel 20 and the flexible wiring substrate 40, together with the protective tape 60. By this means, as shown in FIG. 15, the hot-melt resins 620 become the mold resin 62 to fill in between the light emitting panel 20 and the flexible wiring substrate 40 without a gap.

With the above-described embodiment, a light emitting device 10 to have eight light emitting elements 30 has been described. This is by no means limiting, and the light emitting device 10 may have nine or more or seven or fewer light emitting elements.

A case has been described with the above embodiment where the conductor layer 23 is made of metal. This is by no means limiting, and the conductor layer 23 may be made of a transparent conductive material such as ITO.

A case has been described with the above embodiment where the resin layer 24 is formed with no gap between the substrates 21 and 22. This is by no means limiting, and the resin layer 24 may be formed partially between the substrates 21 and 22. For example, the resin layer 24 may be formed only around the light emitting elements.

A case has been described with the above embodiment where the light emitting panel 20 of the light emitting device 10 has substrates 21 and 22 and a resin layer 24. This is by no means limiting, and the light emitting panel 20 may be comprised only of a substrate 21 and a resin layer 24 that holds light emitting elements 30.

Figure 40:
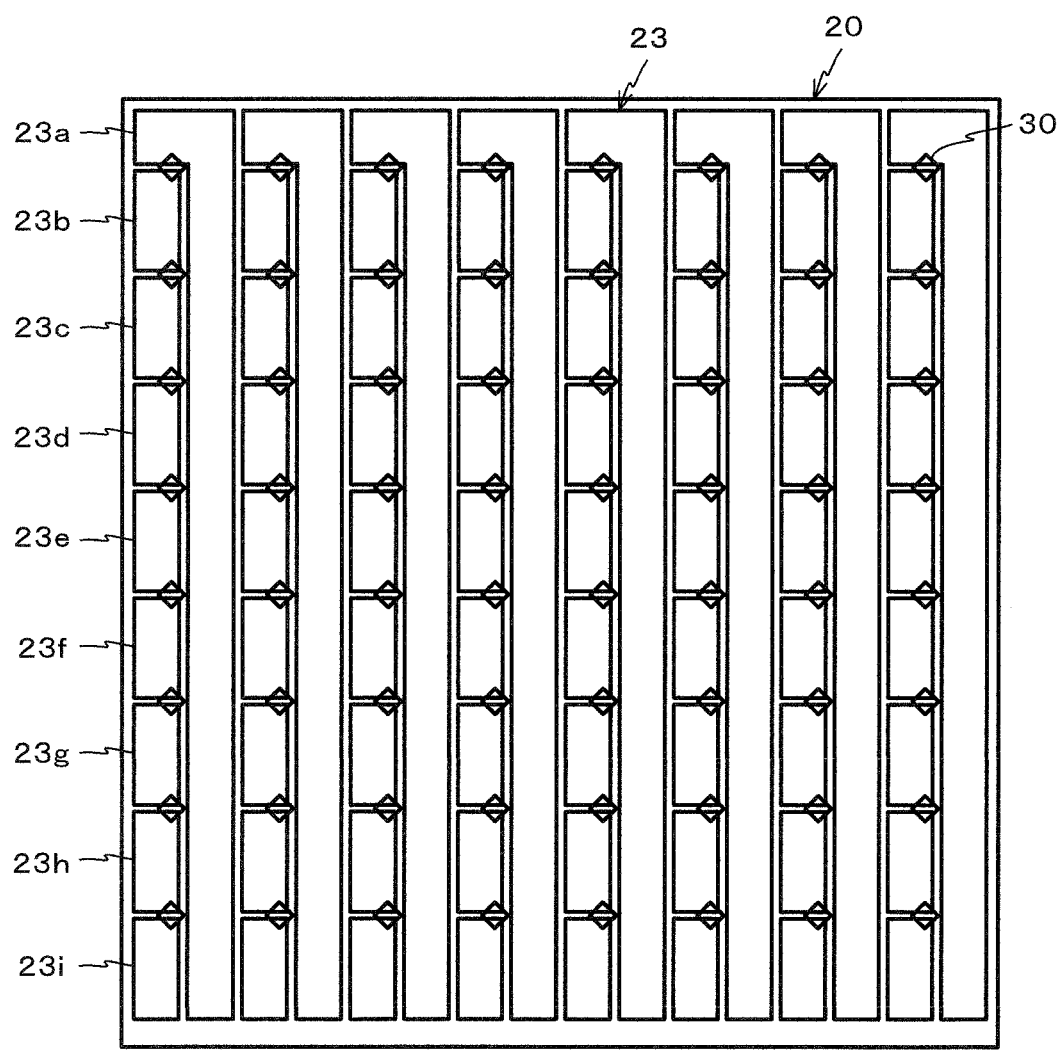
FIG. 40 is a diagram showing a variation of a light emitting panel.

Although an embodiment of the present invention has been described above, the method of manufacturing the light emitting device 10 is disclosed in detail in US Patent Application Publication No. 2017/0250330 (WO/2016/047134). As shown in FIG. 40, a light emitting device, in which light emitting elements are arranged in a matrix shape, is disclosed in detail in Japanese Patent Application No. 2018-164963. Their contents are incorporated herein by reference.

Second Embodiment

Next, a second embodiment will be described below with reference to the accompanying drawings. Components that are the same as or equivalent to those of the first embodiment will be assigned the same or equivalent codes, and their description will be omitted or simplified. The light emitting device 10 according to the second embodiment is different from the light emitting device 10 according to the first embodiment in having a composite sealing unit 61 comprised of a protective tape 60 and a mold resin 62.

Figure 17:
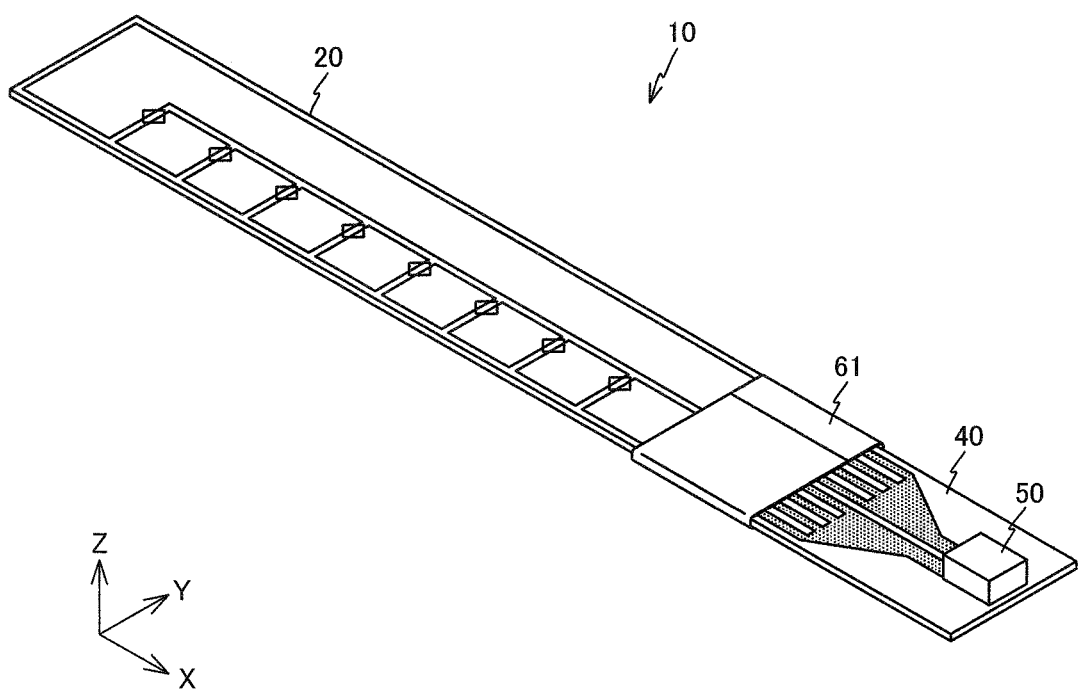
FIG. 17 is a perspective view of a light emitting device according to a second embodiment.

FIG. 17 is a perspective view showing an example of the light emitting device 10 according to the present embodiment. As shown in FIG. 17, the light emitting device 10 is a device whose longitudinal direction runs along the X-axis direction. The light emitting device 10 has a light emitting panel 20 that emits light, a flexible wiring substrate 40 that is connected with the light emitting panel 20, and a connector 50 that is mounted on the flexible wiring substrate 40. A composite sealing unit 61 is wound around the joint part of the light emitting panel 20 and the flexible wiring substrate 40. The width of the light emitting panel 20 is 20 mm.

FIG. 18 is an exploded perspective view of the light emitting device 10. The light emitting panel 20 and the flexible wiring substrate 40 are members whose longitudinal direction runs along the X-axis direction. The flexible wiring substrate 40 is 80-μm thick, and comprised of a base material 41, which serves as the base, a conductor layer 43, which is formed on the upper surface of the base material 41, and a coverlay 42, which covers the conductor layer 43.

The base material 41 is a rectangular member whose longitudinal direction runs along the X-axis direction. This base material 41 is made of polyimide, for example, and a conductor layer 43 is formed on its upper surface. The conductor layer 43 is formed by patterning a copper foil that is stuck on the upper surface of the base material 41. With the present embodiment, the conductor layer 43 is formed with two circuit patterns 43a and 43b.

The circuit patterns 43a and 43b are formed over the base material 41, from the −X-side end to the +X-side end. In the circuit patterns 43a and 43b, the −X-side end part is branched into a plurality of parts, and formed in a tapered shape in which the width of the +X-side end part narrows towards the +X direction.

The conductor layer 43, formed on the upper surface of the base material 41, is covered with the coverlay 42 that is bonded by vacuum thermo-compression.

The connector 50 is a rectangular parallelepiped component, and is connected with a cable routed from a DC power source. The connector 50 is mounted on the upper surface of the +X-side end part of the flexible wiring substrate 40.

The composite sealing unit 61 preferably has excellent heat resistance and insulation, and is comprised of a protective tape 60, which is made of materials such as, for example, polyimide, polyester, polyamide, liquid crystal polymer, PEEK (polyetheretherketone) and so on, and a mold resin 62.

The light emitting panel 20 according to the present embodiment has the same configuration as the light emitting panel 20 according to the first embodiment. As shown in FIG. 3, the light emitting panel 20 has a pair of substrates 21 and 22, a resin layer 24 that is formed between the substrates 21 and 22, and eight light emitting elements $30_1$ to $30_8$ that are arranged inside the resin layer 24.

The substrates 21 and 22 are rectangular substrates, whose longitudinal direction runs along the X-axis direction. The substrate 21 is a film-like member that is approximately 50 to 300-μm thick, and, with the present embodiment, a PET film that is 100-μm thick is used. The substrates 21 and 22 are transparent to visible light. The total luminous transmittance of the substrates 21 and 22 is preferably 5% or more and 95% or less. Note that the total luminous transmittance refers to the total luminous transmittance measured in conformity with the Japanese Industrial Standard JISK7375: 2008.

Also, the substrates 21 and 22 are flexible, and their bending modulus of elasticity is 0 to 320 kgf/mm$^2$, approximately. Note that the bending modulus of elasticity is a value that is measured by a method in conformity with JIS K7171: 2016.

As for the materials for the substrates 21 and 22, polyethylene terephthalate (PET), polyethylene naphthalate (PEN), polycarbonate (PC), polyethylene succinate (PES), cyclic olefin resin, acrylic resin, polyimide, and so forth may be used.

A conductor layer 23, approximately 0.05 μm to 2-μm thick, is formed in the lower surface of the substrate 21 (the surface on the −Z side) between the pair of substrates 21 and 22.

The resin layer 24 is an insulator formed between the substrate 21 and the substrate 22. The resin layer 24 is approximately 50 to 150-μm thick, and made of, for example, an epoxy thermosetting resin, a polyimide thermosetting resin and so forth, which are translucent. The resin layer 24 preferably has a transmittance of 5% or higher, and is made of materials that are primarily composed of thermosetting resins. The materials to constitute the resin layer 24 may contain other resin components or the like if necessary. As for the thermosetting resins, epoxy resin, acrylic resin, styrene resin, ester resin, urethane resin, melamine resin, phenol resin, unsaturated polyester resin, diallyl phthalate resin, polyimide and so forth may be used.

The resin layer 24 may be made of resins containing thermoplastic resins as main components. The thermoplastic resins may include polypropylene resin, polyethylene resin, polyvinyl chloride resin, acrylic resin, Teflon resin (registered trademark), polycarbonate resin, acrylonitrile butadiene styrene resin, polyamideimide resin, and so forth.

The resin layer 24 according to the present embodiment is also disclosed in detail in US Patent Application Publication No. 2016/0155913 (WO2014156159). Its content is incorporated herein by reference. Furthermore, the physical properties of the resin layer 24 such as mechanical loss tangent are disclosed in detail in Japanese Patent Application No. 2018-164946. Its content is incorporated herein by reference.

In the light emitting device 10, the substrate 22 is shorter than the substrate 21 in the X-axis direction. Consequently, the +X-side end of the conductor layer 23 is exposed.

Figure 19:
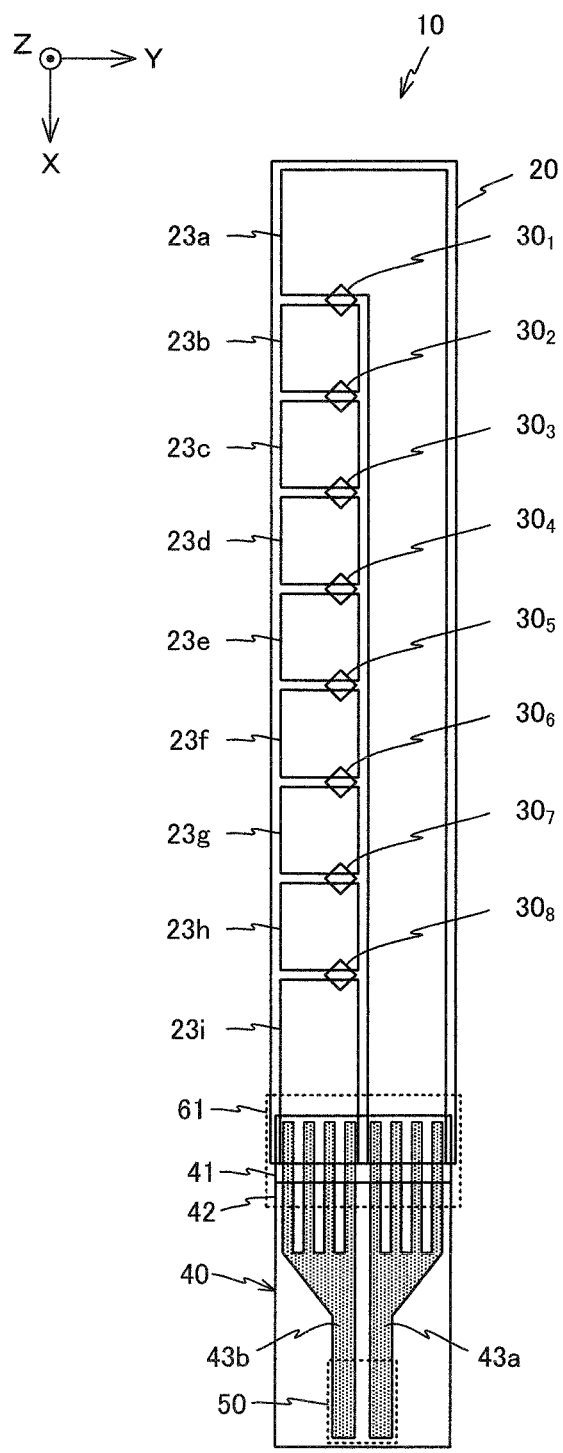
FIG. 19 is a plan view of the light emitting device.

FIG. 19 is a plan view of the light emitting device 10. As can be seen by referring to FIG. 19, the conductor layer 23 is comprised of an L-shaped conductor pattern 23a, which is formed along the +Y-side outer edge of the substrate 21, and a plurality of rectangular conductor patterns 23b to 23i, which are arrayed along the −Y-side outer edge of the substrate 21. The conductor patterns 23a to 23i are made of metallic materials such as copper (Cu), silver (Ag) and so on. In the light emitting device 10, the distances among the conductor patterns 23a to 23i are approximately 100 μm or less. The conductor patterns 23a to 23i are in a mesh pattern comprised of a plurality of line patterns that are orthogonal to each other. The line width of the line patterns is approximately 5 μm, and the array pitch is approximately 150 μm.

The conductor layer 23 is by no means limited to a mesh pattern, and may assume a stripe pattern, a honeycomb pattern and so forth, or may be, furthermore, a patterned transparent conductor film or the like. The conductor layer 23 has only to be a material having a total luminous transmittance of 5% or more and 95% or less, and a sheet resistance of 100 Ω/sq or less.

The conductor patterns to constitute the conductor layer 23 are disclosed in detail in US Patent Application Publication No. 2016/0276322 (WO/2015/083366). Its content is incorporated herein by reference.

The light emitting elements $30_1$ to $30_8$ according to the present embodiment have the same configuration as the light emitting elements $30_1$ to $30_8$ according to the first embodiment. As can be seen by referring to FIG. 5, the light emitting elements $30_1$ to $30_8$ are square LED chips, and LED chips of a four-layer structure, comprised of a base substrate 31, an N-type semiconductor layer 32, an active layer 33, and a P-type semiconductor layer 34.

The bumps 37 and 38 to be provided in the light emitting element 30 are also disclosed in detail in US Patent Application Publication No. 2016/0276561 (WO/2015/083365). Its content is incorporated herein by reference. Also, the electrical connection between the bumps 37 and 38 and the conductor layer 23 in the light emitting device is disclosed in detail in Japanese Patent Application NO. 2018-16165. Its content is incorporated herein by reference.

Figure 6:
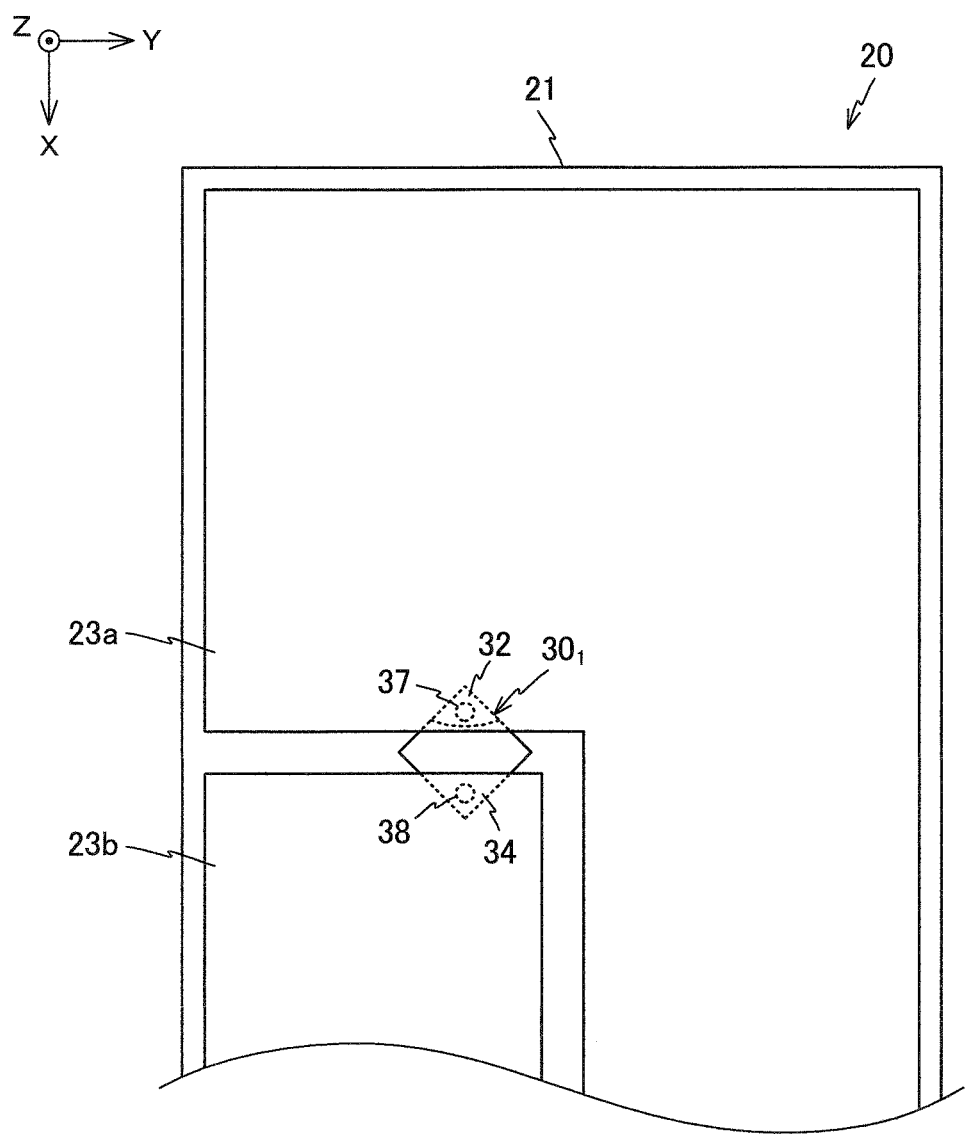
FIG. 6 is a diagram showing the light emitting element connected to a mesh pattern.

As can be seen by referring to FIG. 6, the light emitting element $30_1$ is arranged between the conductor patterns 23a and 23b, the bump 37 is connected to conductor pattern 23a, and the bump 38 is connected to the conductor pattern 23b.

The N-type semiconductor layer 32 of the light emitting element $30_1$ faces only the conductor pattern 23a where the bump 37 is connected, and the P-type semiconductor layer 34 of the light emitting element $30_1$ faces both the conductor pattern 23a where the bump 37 is connected and the conductor pattern 23b where the bump 38 is connected.

Other light emitting elements $30_2$ to $30_8$ also have the same configuration as the light emitting element $30_1$. Then, the light emitting element $30_2$ is arranged between conductor patterns 23b and 23c, and bumps 37 and 38 are respectively connected to the conductor patterns 23b and 23c. Following this in a similar fashion, the light emitting element 303 is arranged over conductor patterns 23c and 23d. The light emitting element $30_4$ is arranged over conductor patterns 23d and 23e. The light emitting element $30_5$ is arranged over conductor patterns 23e and 23f. The light emitting element $30_6$ is arranged over conductor patterns 23f and 23g. The light emitting element $30_7$ is arranged over conductor patterns 23g and 23h. The light emitting element $30_8$ is arranged over conductor patterns 23h and 23i. By this means, the conductor patterns 23a to 23i and the light emitting elements $30_1$ to $30_8$ are connected in series. In the light emitting panel 20, light emitting elements 30 are arranged at approximately 10-mm intervals.

The flexible wiring substrate 40 according to the present embodiment has a configuration equivalent to that of the flexible wiring substrate 40 according to the first embodiment. As can be seen by referring to FIG. 7, the coverlay 42 of the flexible wiring substrate 40 is shorter than the base material 41 in the X-axis direction. Consequently, the –X-side end part of the conductor layer 43 is exposed.

The flexible wiring substrate 40 is disclosed in detail in US Patent Application Publication No. 2016/0276321 (WO/2015/083364). Its content is incorporated herein by reference.

Figure 20:
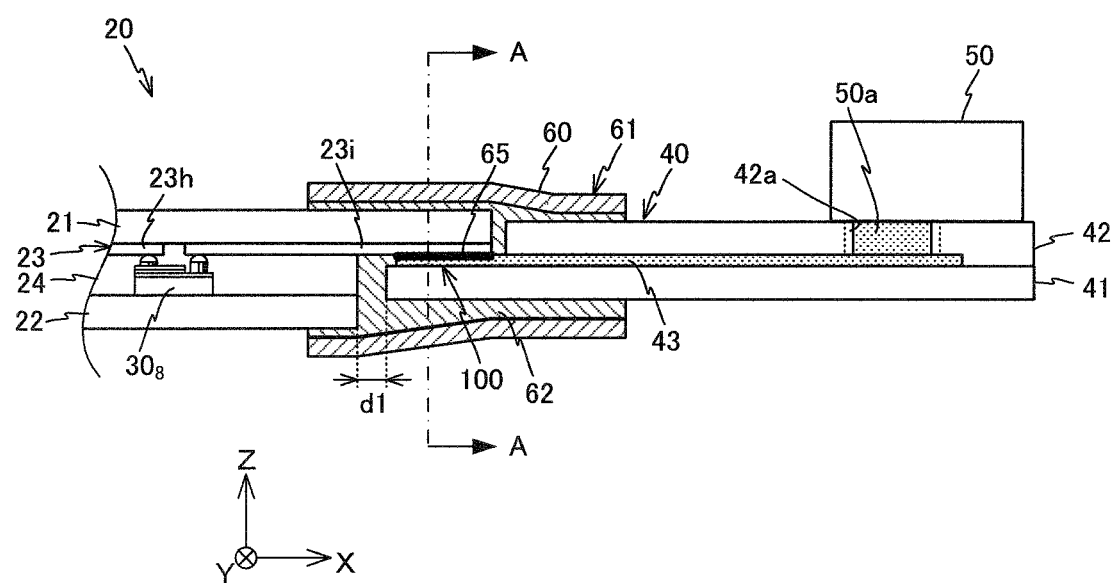
FIG. 20 is a diagram showing a joint part of a light emitting panel and a flexible wiring substrate.

As shown in FIG. 20, the flexible wiring substrate 40 is bonded to the light emitting panel 20, in a state in which the conductor layer 43, which is exposed from the coverlay 42, is in contact with the +X-side end part of the conductor layer 23 of the light emitting panel 20. For example, an anisotropic conductive film (ACF) 65 is used to bond the conductor layer 43 and the conductor layer 23. For the anisotropic conductive film 65, for example, a thermosetting adhesive, which has a film thickness of approximately 25 µm, and in which, for example, Ni having a particle diameter of approximately 2 µm is mixed as a conductive material, can be used. Furthermore, instead of an anisotropic conductive film, an anisotropic conductive paste, an anisotropic conductive ink, and so forth may be used to bond between the conductor layer 43 and the conductor layer 23. The anisotropic conductive paste and the anisotropic conductive ink can be applied to the joint part of the conductor layer 43 and the conductor layer 23 by printing, by using ink jet, and so on.

The anisotropic conductive film (ACF) 65 is disclosed in US Patent Application Publication No. 2016/0276321 (WO/2015/083364). Its content is incorporated herein by reference.

The gap between the resin layer 24 and substrate 22 that constitute the light emitting panel 20 and the base material 41 that constitutes the flexible wiring substrate 40 is filled with a mold resin 62. The distance dl of the above gap (the size in the X-axis direction) is approximately 2 mm. The mold resin 62 constitutes the composite sealing unit 61 together with the protective tape 60. The mold resin 62 is a resin that constitutes the adhesive layer of the composite sealing unit 61.

The mold resin 62 is a thermosetting resin. Epoxy resin, acrylic resin, styrene resin, ester resin, urethane resin, melamine resin, phenol resin, unsaturated polyester resin, diallyl phthalate resin, polyimide and the like can be used as thermosetting resin for the mold resin 62. The minimum melt viscosity of the mold resin 62 is 1.0 E+0.5 Pa·s or less. The mold resin 62 is in close contact with the side surfaces of the resin layer 24, the substrate 22 and the base material 41, and the conductor layer 23 (conductor patterns 23a and 23i), without a gap.

The mold resin 62 may be a thermoplastic resin. For the thermoplastic resin, polypropylene resin, polyethylene resin, polyvinyl chloride resin, acrylic resin, Teflon resin (registered trademark), polycarbonate resin, acrylonitrile butadiene styrene resin, polyamideimide resin, and so forth can be used. A hot-melt adhesive may be used as the mold resin 62. Adhesives of ethylene vinyl acetate type, olefin type, rubber type, polyamide type such as polyester, and polyurethane type, or or a thermoplastic olefin polymer such as propylene, or those obtained by copolymerizing propylene and ethylene, propylene and butene-1, and so forth can be used as hot-melt adhesives.

When the connector 50 is mounted on the flexible wiring substrate 40, a pair of terminals 50a of the connector 50 are respectively connected with the circuit patterns 43a and 43b constituting the conductor layer 43 of the flexible wiring substrate 40, through the opening part 42a provided in the coverlay 42.

Next, the procedures for connecting the light emitting panel 20 and the flexible wiring substrate 40 in the light emitting device 10 described above will be described.

Figure 21:
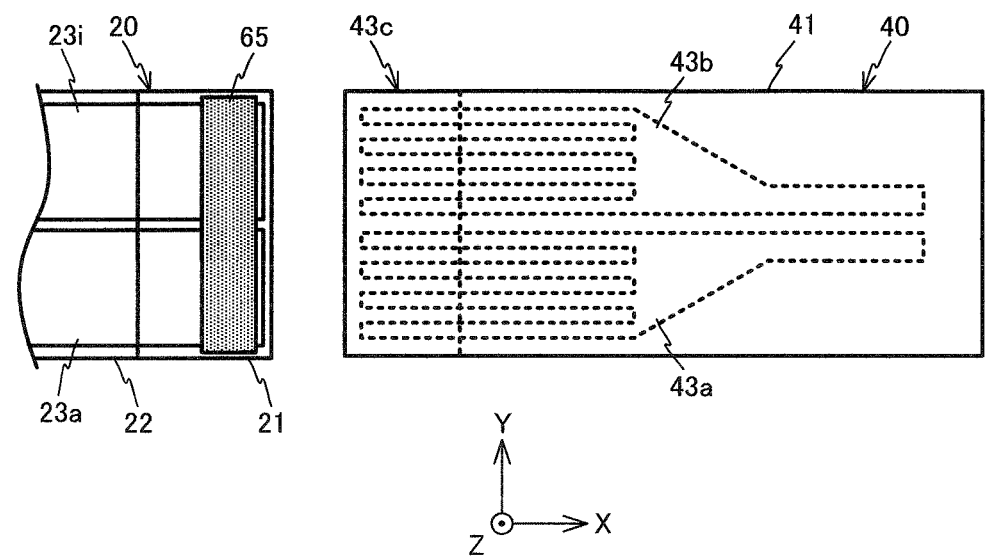
FIG. 21 is a diagram for illustrating a method of manufacturing the light emitting device.
Figure 22:
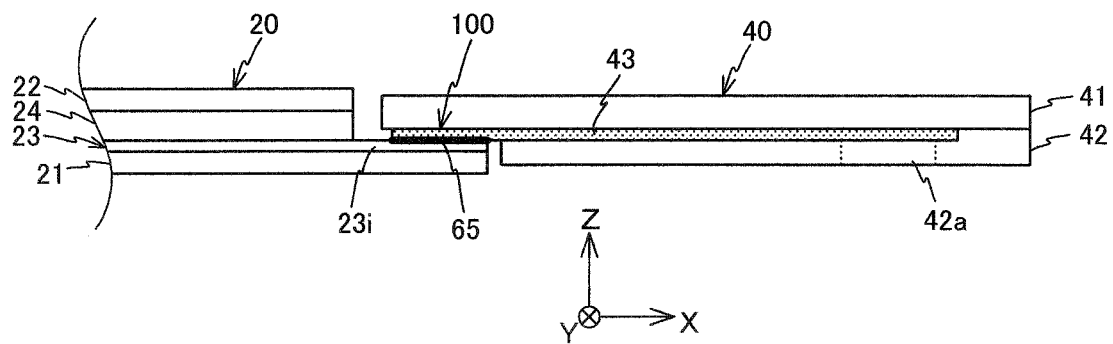
FIG. 22 is a diagram for illustrating the method of manufacturing the light emitting device.

First, referring to FIG. 21, an anisotropic conductive film 65 is arranged in end parts of the conductor patterns 23a and 23i that expose from the +X-side end part of the light emitting panel 20. The anisotropic conductive film 65 is arranged over the conductor patterns 23a and 23i. Then, as shown in FIG. 22, the conductor patterns 23a and 23i of the conductor layer 23 that constitute the light emitting panel 20 and the conductive layer 43 that is exposed from the end part of the flexible wiring substrate 40 are bonded by thermo-compression using the anisotropic conductive film 65, so that electrical contact is achieved.

With the light emitting device 10, the joint part 100 of the light emitting panel 20 and the flexible wiring substrate 40 is sealed with the mold resin 62 and their outer periphery is covered with the protective tape 60, thereby achieving sealing of high mechanical reliability. To do so, the joint part 100 is covered with the mold resin 62 by applying the mold resin 62 to the joint part 100, winding the mold resin 62, and so on.

After the protective tape 60 is wound around the mold resin 62, the mold resin 62 may be heated, bonded by thermo-compression, or bonded by vacuum thermo-compression, but, when doing so, voids are likely to remain between the protective tape 60 and the mold resin 62. Consequently, there is a possibility that problems such as moisture seeping into the joint part 100 might arise.

Figure 23:
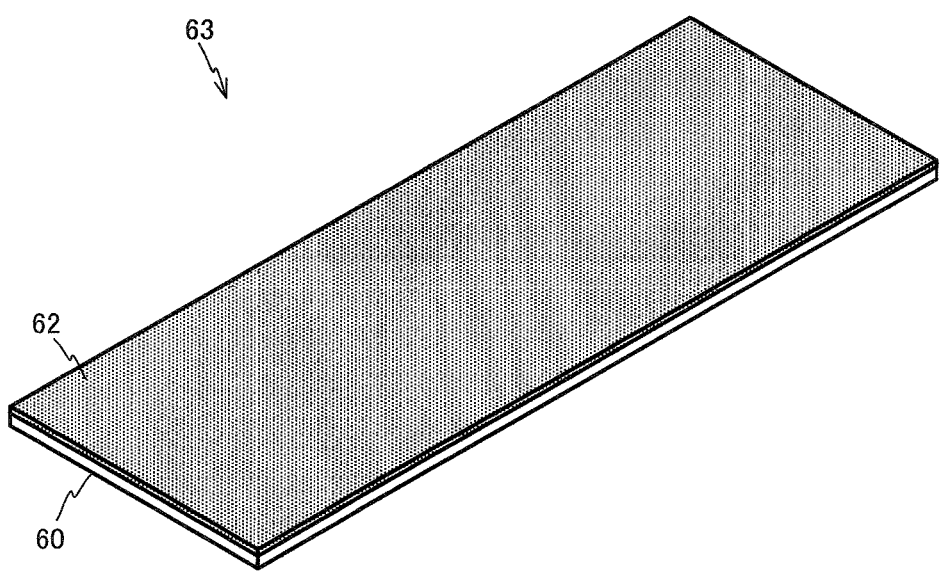
FIG. 23 is a perspective view of a composite sealing material.

Therefore, as shown in FIG. 23, a composite sealing material 63 that is long enough to be wound around the joint part 100 is prepared. This composite sealing material 63 is a member to serve as the composite sealing unit 61 by way of thermo-compression bonding. The composite sealing material 63 is comprised of a protective tape 60 and a mold resin 62 that serves as an adhesive layer. The thickness of the mold resin 62 that constitutes the composite sealing material 63 is adjusted by, for example, stacking 20-µm thick resin sheets. The thickness of the mold resin 62 is, for example, 60 µm to 120 µm. In this way, the composite sealing material 63, in which a protective tape 60 and a mold resin 62 are stacked in advance, is wound around the joint part 100 and then bonded by vacuum thermo-compression, so that the joint part 100 with no remaining voids can be formed in a small number of steps.

As shown in FIG. 24, the composite sealing material 63 is wound around the joint part 100 of the light emitting panel 20 and the flexible wiring substrate 40. The composite sealing material 63 needs to be long enough to wrap around the light emitting panel 20 and the flexible wiring substrate 40 once when the composite sealing material 63 is wound around the joint part 100 of the light emitting panel 20 and the flexible wiring substrate 40. To be more specific, looking at one position among positions P0 to P3 in the portion where the composite sealing unit 61 is wound around, the value of 2πR (the length of the entire circumference) of the length of the composite sealing unit 61 in that position needs to show a length that is long enough to wrap around the light emitting panel 20 and the flexible wiring substrate 40 by 1.125 times or more and 1.8755 times or less. This is because, if the length of the composite sealing unit 61 is below this range, problems such as water seeping into the joint part 100 are likely to arise, and, if the length of the composite sealing unit 61 is beyond this range, the flexibility of the light emitting device 10 is likely to be damaged severely.

When the composite sealing material 63 is wound around the light emitting panel 20 and the flexible wiring substrate 40, as shown in FIG. 25, the composite sealing material 63 is fixed to the light emitting panel 20 and the flexible wiring substrate 40 on a temporary basis. To fix the composite sealing material 63 on a temporary basis, an adhesive may be applied to the composite sealing material 63 or the mold resin 62, separately, before the composite sealing material 63 is wound.

Next, the composite sealing material 63 is bonded, by thermo-compression, to the light emitting panel 20 and the flexible wiring substrate 40. By this means, the mold resin 62 of the composite sealing material 63 fills between the light emitting panel 20 and the flexible wiring substrate 40, with no gap, as shown in FIG. 26. The mold resin 62 is in close contact, without a gap, with the side surfaces of the resin layer 24, the substrate 22 and the base material 41, and with the conductor layers 23 (conductor patterns 23a and 23i) that is exposed.

With the light emitting device 10 described above, when a DC voltage is applied to the circuit patterns 43a and 43b shown in FIG. 19 via the connector 50, the light emitting elements 30 that constitute the light emitting panel 20 emit light. With the light emitting device 10, a voltage of approximately 20 V is applied to the circuit patterns 43a and 43b.

As described above, with the present embodiment, when manufacturing the light emitting device 10, for example, as shown in FIG. 25, a composite sealing material 63 is wound around the joint part 100 of the light emitting panel 20 and the flexible wiring substrate 40. Next, the composite sealing material 63 is bonded, by thermo-compression, to the light emitting panel 20 and the flexible wiring substrate 40. Having undergone the above steps, the mold resin 62 fills between the light emitting panel 20 and the flexible wiring substrate 40.

This mold resin 62 is in close contact, without a gap, with the side surfaces of the resin layer 24, the substrate 22, and the base material 41, and with the conductor layers 23 (conductor patterns 23a and 23i) that is exposed. Therefore, the conductor layer 23 that is exposed is not exposed to outside air or condensation, so that the corrosion of the conductor layer 23, migration-induced dielectric breakdown and so forth can be reduced, and, consequently, deterioration of the joint part 100 over time can be reduced. Consequently, the reliability of the light emitting device 10 can be improved.

Note that, with the present embodiment, the composite film material formed by stacking a protective tape 60 and a mold resin 62 was referred to as a "composite sealing material 63," and the portion that is defined inside the light emitting device 10 after being wound around the joint part 100 of the light emitting panel 20 and the light emitting device 10 and processed was referred to as a "composite sealing unit 61."

The gap length dl between the light emitting panel 20 and the flexible wiring substrate 40 in FIG. 20 is preferably 1 mm or more and 5 mm or less, and, more preferably, 1.5 mm or more and 3 mm or less. The reason is, when the composite sealing material 63, which serves as the composite sealing unit 61, is bonded by vacuum thermo-compression, the mold resin 62 that is deformed and spreads fills voids near the joint part 100, and the buffering effect of this prevents the deformation of the joint part 100, and, as a result of this, the reliability of the joint part is improved, and the penetration of water from outside is prevented. Furthermore, if the gap length dl is less than 1 mm, it is more likely that enough mold resin 62 is not filled there, and therefore voids are produced. Furthermore, when the gap length dl exceeds 5 mm, the bonding of the gap portion becomes weak, and peeling or cracking occurs under severe use conditions such as when repeated stress is applied, and the long-term reliability is damaged.

For example, after the light emitting panel 20 and the flexible wiring substrate 40 are bonded using the anisotropic conductive film 65, it may be possible to use the protective tape 60 alone, to reinforce the joint part 100, or to take measures against moisture. However, it is difficult to seal, sufficiently, the gap between the light emitting panel 20 and the flexible wiring substrate 40 that are connected with each other, with the protective tape 60 alone. Consequently, migration-induced dielectric breakdown, deterioration of the joint part 100 over time, and so forth cannot be reduced sufficiently. With the present embodiment, the mold resin 62 is filled between the light emitting panel 20 and the flexible wiring substrate without a gap, so that migration-induced dielectric breakdown, deterioration of the joint part 100 over time and so forth can be reduced sufficiently.

In addition, the mold resin 62 can be formed easily and in a short time, compared to cases in which the mold resin 62 is formed by, for example, potting resin, spreading resin using a dispenser, and so forth. Furthermore, with the present embodiment, the process of forming the mold resin 62 can be carried out in parallel with the thermal compression bonding process of the composite sealing material 63. Therefore, the process of manufacturing the light emitting device 10 can be simplified, and, furthermore, the cost for manufacturing the light emitting device 10 can be reduced.

The thickness of the mold resin 62 of the composite sealing material 63 is preferably 60 µm or more, and, more preferably, 80 µm or more. By making the thickness of the mold resin 62 of the composite sealing material 63 60 µm or more, it is possible to prevent moisture and the like from seeping into the joint part 100 of the light emitting panel 20 and the flexible wiring substrate 40. Furthermore, by making the thickness the mold resin 62 of the composite sealing material 63 80 µm or more, it is possible to prevent, nearly completely, moisture and the like from seeping into the joint part 100 of the light emitting panel 20 and the flexible wiring substrate 40.

With the light emitting device 10, the thickness of the mold resin 62 of the composite sealing material 63 is preferably thin, from the perspective of ensuring flexibility. With the present embodiment, the flexibility of the light emitting device 10 can be maintained by making the thickness of the mold resin 62 of the composite sealing material 63 160 µm or less.

When the mold resin 62 of the composite sealing unit 61 is thermo-compression-bonded, its thickness becomes approximately 80%. Therefore, the thickness of the mold resin 62 of the light emitting device 10 is preferably 56 µm or more, and, more preferably, 64 µm or more. Also, the thickness of the mold resin 62 of the light emitting device 10 is preferably 128 µm or less. Therefore, the thickness of the thickest part of the light emitting device 10, including the composite sealing unit 61, in the joint part 100 of the light emitting panel 20 and the flexible wiring substrate 40 needs to be equal to or greater than the value adding 138 µm to the thickness of the light emitting panel 20, and needs to be less than or equal to the value adding 446 µm to the thickness of the light emitting panel.

The optimum value for the thickness of the mold resin 62 determined as described above varies depending on the sum of the thickness of the substrate 22 and the thickness of the resin layer 24. With the light emitting device 10, the sum of the thickness of the substrate 22 and the thickness of the resin layer 24, or "SUM," is approximately 220 µm. With the light emitting device 10, the thickness of the mold resin 62 may be smaller than SUM, and the thickness of the mold resin 62 is preferably 25% or more and 58% or less of SUM, and, more preferably, 29% or more and 58% or less.

Similarly, the optimum value for the thickness of the mold resin 62 varies depending on the thickness of the flexible wiring substrate 40. With the light emitting device 10, the flexible wiring substrate 40 is approximately 80-µm thick. With the light emitting device 10, the thickness of the mold resin 62 is preferably 70% or more and 160% or less, of the thickness of the flexible wiring substrate 40, and, more preferably, 80% or more and 160% or less.

The light emitting device 10 with the protective tape 60 and the mold resin 62 can maintain the adhesion strength high near the joint part 100 of the light emitting panel 20 and the flexible wiring substrate 40. By this means, it is possible to prevent the light emitting panel 20 and the flexible wiring substrate 40 from parting.

With the light emitting device 10, as shown in FIG. 20, the distance dl between the substrate 22 and the flexible wiring substrate 40 is approximately 2 mm. The thickness of the mold resin 62 is preferably 2% or more and 5% or less of the distance dl, and, more preferably, 3% or more and 5% or less.

Now, although embodiments of the present invention have been described above, the present invention is by no means limited to the embodiments described above. For example, with the above embodiments, light emitting devices 10 to have eight light emitting elements 30 connected in series have been described. This is by no means limiting, and a light emitting device 10 may have nine or more or seven or fewer light emitting elements. A light emitting device 10 may have a plurality of light emitting elements 30 that are connected in parallel. Also, a light emitting device 10 may have a plurality of light emitting elements 30, where light emitting elements 30 connected in series and light emitting elements 30 connected in parallel are mixedly present.

A case has been described with the above embodiment where the conductor layer 23 is made of metal. This is by no means limiting, and the conductor layer 23 may be made of a transparent conductive material such as ITO.

A case has been described with the above embodiment where bumps 37 and 38 are formed on the electrodes 35 and 36 of light emitting elements 30. This is by no means limiting, and the bumps 37 and 38 may not be formed on the electrodes 35 and 36 of light emitting elements 30.

In the above embodiments, a pair of electrodes 35 and 36 were formed on the surface of a light emitting element 30 on one side. This is by no means limiting, and a light emitting element 30 may be a light emitting element that has electrodes on the surface on one side and on the surface on the other side. In this case, a conductor layer is also formed on the substrate 22.

Figure 35:
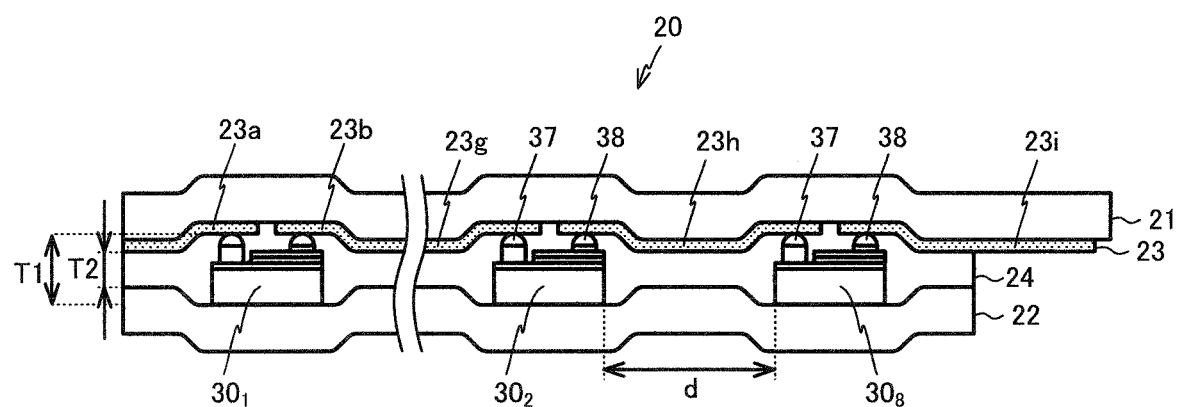
FIG. 35 is a diagram for illustrating a shape of a light emitting panel.

As shown in FIG. 35, in practice, the substrates 21 and 22 are shaped to curve along the light emitting elements 30. To be more specific, the thickness T2 of the resin layer 24 is smaller than the height T1 of the light emitting elements $30_1$ to $30_8$ so as to place the conductor layer 23 and the bumps 37 and 38 in good contact with each other. The substrates 21 and 22 that are in close contact with the resin layer 24 have curved shapes so that the parts where the light emitting elements $30_1$ to $30_8$ are arranged protrude outward and the parts in between the light emitting elements $30_1$ to $30_8$ are depressed. Because the substrates 21 and 22 are curved in this way, the conductor layer 23 is in a state of being pressed against the bumps 37 and 38 by the substrates 21 and 22.

Figure 36:
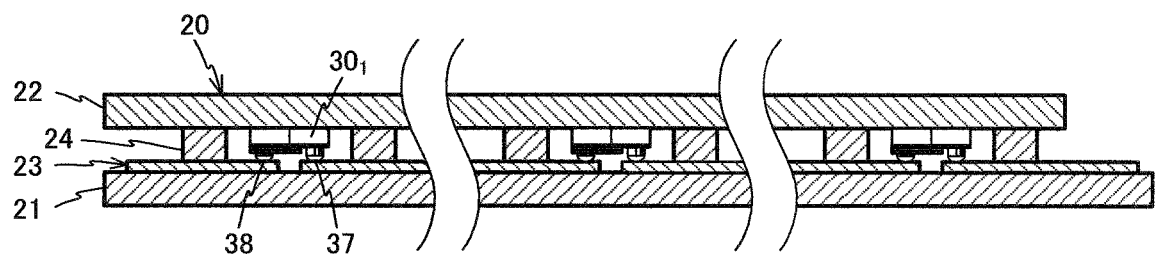
FIG. 36 is a diagram showing a variation of the light emitting panel.

Cases have been described with the above embodiments where a resin layer 24 is formed, with no gap, between substrates 21 and 22. This is by no means limiting, and the resin layer 24 may be formed between the substrates 21 and 22 only partially. For example, the resin layer 24 may be formed only around light emitting elements. For example, as shown in FIG. 36, the resin layer 24 may be formed so as to constitute a spacer to surround light emitting elements 30.

Figure 37:
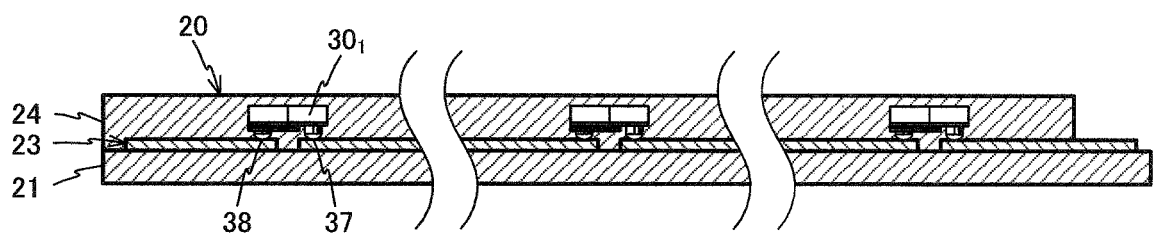
FIG. 37 is a diagram showing a variation of the light emitting panel.

Cases have been described with the above embodiments where the light emitting panel 20 of a light emitting device 10 has a pair of substrates 21 and 22 and a resin layer 24. This is by no means limiting, and, as shown in FIG. 37, a light emitting panel 20 may be comprised of one substrate 21, and a resin layer 24 that holds light emitting elements 30.

There may be cases where, in a light emitting device 10, the light emitting panel 20 and the flexible wiring substrate 40 are not arranged on the same plane. Especially when the light emitting device 10 is mounted on a vehicle, it is often the case that the light emitting panel 20 and wiring/circuit portions such as the flexible wiring substrate 40 are not arranged on the same plane. In such cases, it is necessary to consider that the joint part 100 of the light emitting panel 20 and the flexible wiring substrate 40 is pulled in directions to part from the plane on which the light emitting panel 20 is arranged, and/or that a bending stress is applied repetitively to the joint part 100 of the light emitting panel 20 and the flexible wiring substrate 40.

In addition, when using the light emitting device 10 to be mounted on a vehicle, it is also necessary to take into account that impacts due to high temperature and high humidity also apply, in addition to and at the same time with the above stress. Consequently, both the stress that applies to the light emitting device 10 and the impact of use in a high-temperature and high-humidity environment on the light emitting device 10 need to be taken into account when making an evaluation. To ensure the reliability of the light emitting device 10 for mounting on a vehicle, as for the tensile stress, the light emitting device 10 needs to withstand application of a 16-N tensile stress, and, as for repeated bending (vibration), the light emitting device 10 needs to withstand 1000 times of repeated bending at 4 N, and, furthermore, the light emitting device 10 must operate normally even after 1000 hours of operation under the conditions of 85° C. temperature and 85% humidity. From this perspective, the following tests have been conducted for the light emitting device 10 according to the present embodiment.

Hereinafter, testing and evaluation methods that have been conducted for the light emitting device 10 according to the present embodiment will be described.

<Infiltration Search Test>

An infiltration search test was conducted on the light emitting device 10 obtained then, substantially in compliance with JIS Z 2343-1, "Part 1: General principles—Method for liquid penetrant testing and classification of the penetrant indication" and JIS Z 2343-2, "Part 2: Testing of penetrant materials." To be more specific, an R-3B (NT) water-washable penetrant manufactured by Eishin Kagaku Co., Ltd. was used, and the light emitting device 10 was immersed in this penetrant for 24 hours under vacuum, and then immersed in the penetrant for 24 hours under normal pressure. Immediately after this, microscopic observation was made from the upper surface of the joint part 100, and whether or not the penetrant had infiltrated was checked. The number of specimens was five.

<Cross-Sectional Void Observation Test>

A cross-sectional void observation test for the light emitting device 10 was conducted. In the cross-sectional void observation test, after the light emitting device 10 was cut along the line AA of FIG. 20, the cut plane, polished, was observed with an optical microscope, and whether or not there were voids in regions on the inner side of the protective tape 60 was checked. The number of specimens was five.

<Average 90-Degree Peeling Durability Test>

Figure 28:
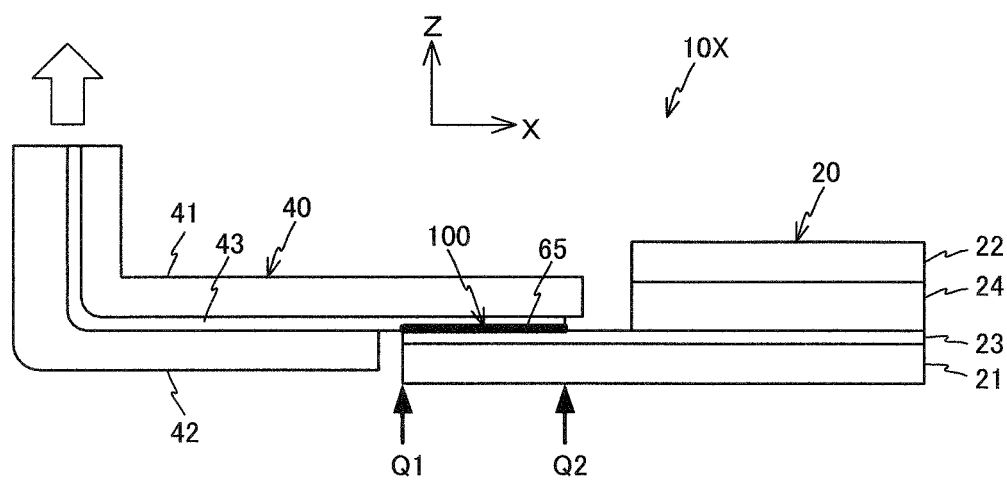
FIG. 28 is a diagram for illustrating a summary of a 90-degree peeling durability test.
Figure 31:
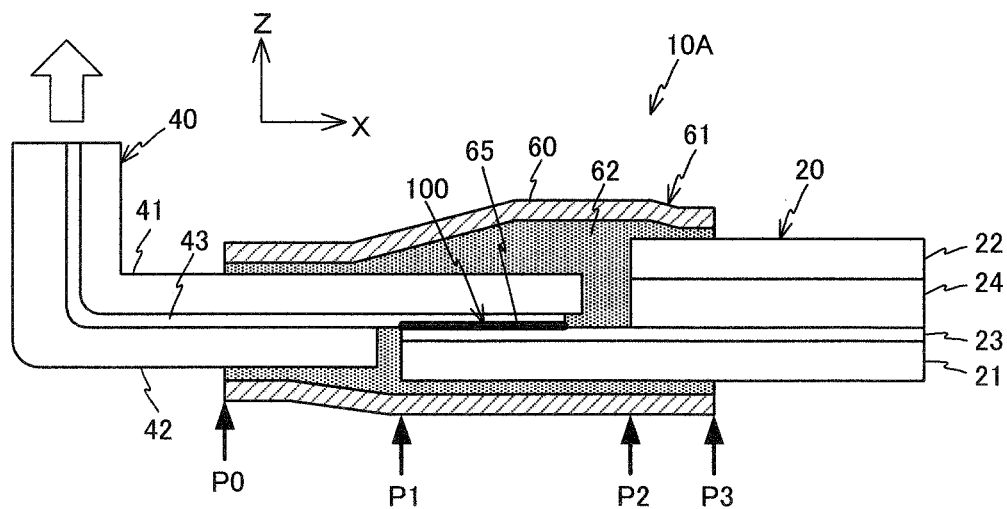
FIG. 31 is a diagram for illustrating a summary of the 90-degree peeling durability test.

An average 90-degree peeling durability test was conducted for the light emitting device 10. The testing method was basically the same as the 90-degree peeling test in compliance with JIS K 6854-1: 1999. In the 90-degree peeling test, as shown in FIG. 28 and FIG. 31, the light emitting panel 20 was placed on a sturdy surface plate, and the substrate 21 was bonded to the surface plate. Regarding the bonding of the substrate 21, the +X-side region from position Q2 in FIG. 28 or the +X-side region from position P3 in FIG. 31 was bonded to the surface plate, to keep the horizontal state. Then, the flexible wiring substrate 40 was peeled from the light emitting panel 20 by pulling the flexible wiring substrate 40 vertically upward, and, meanwhile, the durability against peeling (N/cm) was measured at each position.

In the average 90-degree peeling durability test, a 90-degree peeling measurement machine by Nissin Kagaku Kabushiki Kaisha was used for the peeling measurement machine. A measurement machine by Aikoh Engineering Co., Ltd., model 9520, was used for the strength measurement machine. A collector by Keyence Corporation, model GR-3500, was used for the data collector. Furthermore, the direction of peeling was 90 degrees, the width of peeling was 5 mm, the speed of peeling was 24 mm/sec, and the sampling time was 50 ms/s.

The position where the measurement was started was position Q1 in FIG. 28, or position P0 in FIG. 31. That is, when the light emitting device 10 had no mold resin 62 or protective tape 60, the point where the anisotropic conductive film 65 started peeling from the conductor layer 23 or the substrate 21 was the position the measurement was started. Also, when the light emitting device 10 had a mold resin 62 and a protective tape 60, the point where the mold resin 62 started peeling from the coverlay 42 was the position the measurement was started. The position where the measurement was finished was the point in the joint part 100 where the electrical contact between the anisotropic conductive film 65 and the conductor layer 23 was cut. The starting point was determined visually, and the end point was determined from changes in the electrical resistance of the conductor layer 43 and the conductor layer 23.

Figure 30:
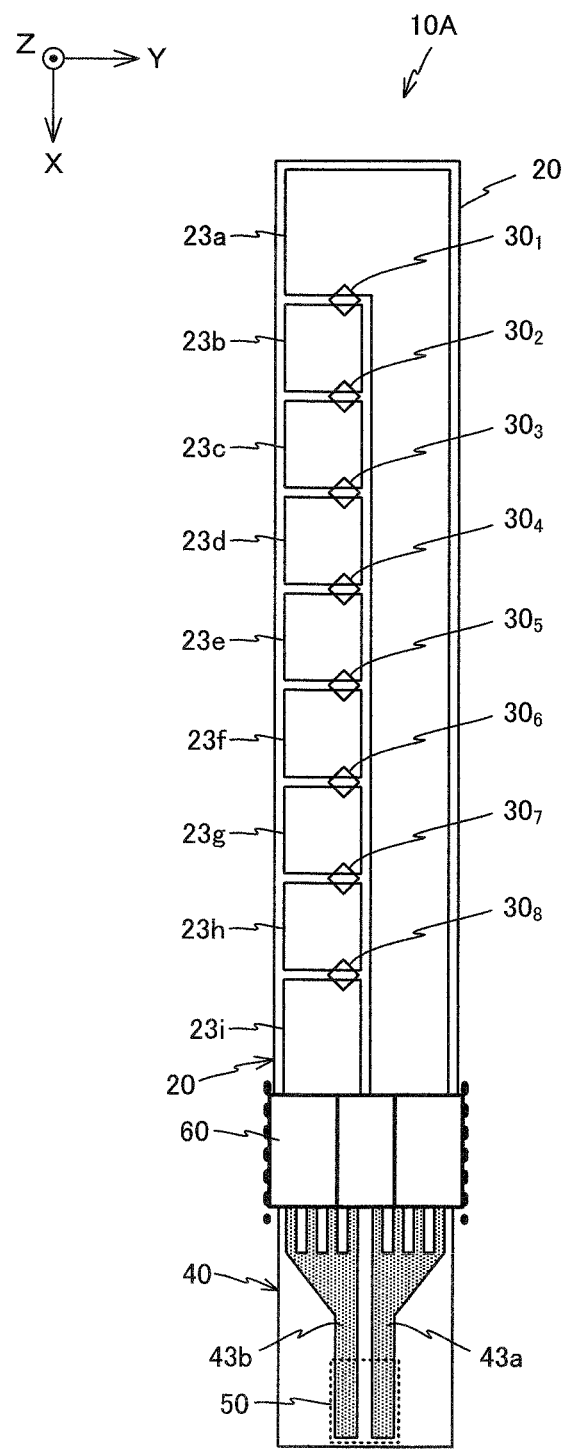
FIG. 30 is a diagram for illustrating a summary of a 90-degree peeling durability test.

The average value of adhesion strength (N/cm) from the starting position to the end position was defined as the average 90-degree peeling durability of the light emitting device 10. Note that, when the protective tape 60 was wound around the joint part 100 and its vicinity, or, to be more specific, when the protective tape 60 was wound around the portion of position P0 or position P3 in the light emitting device 10 illustrated in FIG. 31, both ends of the protective tape 60 when seeing the light emitting device 10 into the −Z direction were cut in advance along the broken lines, as shown in FIG. 30, and the test was conducted. By so doing, the test was conducted in a state in which the protective tape 60 was separated vertically. The number of specimens in this test was five.

Figure 29:
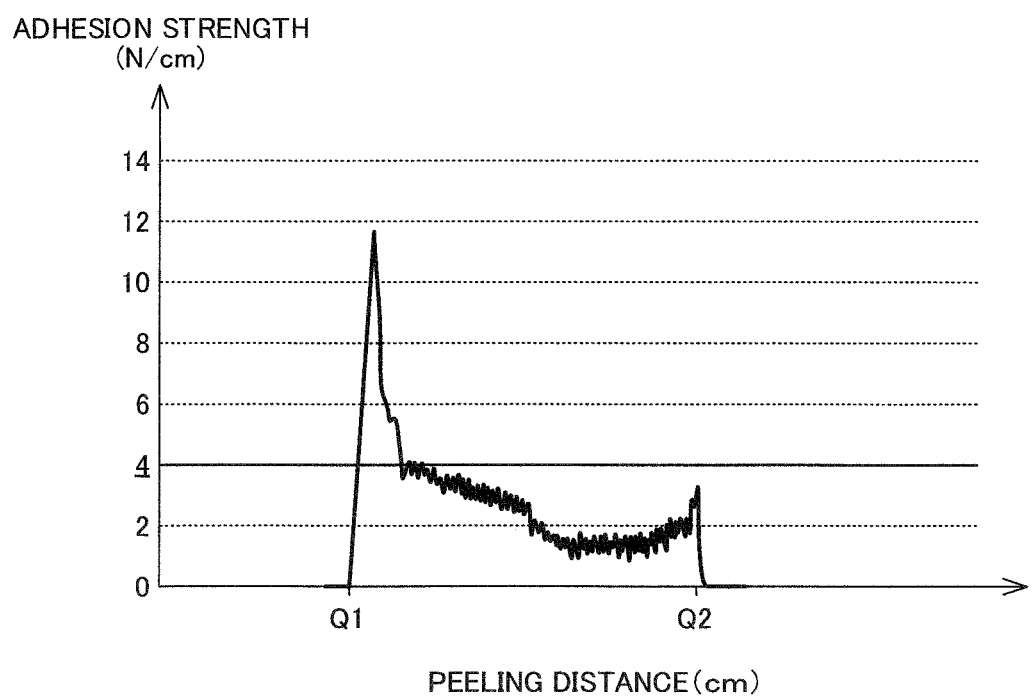
FIG. 29 is a diagram showing a result of the 90-degree peeling durability test.

FIG. 29 is a diagram showing the result of the peeling test conducted with the light emitting device 10 shown in FIG. 28, which has no protective tape 60 or mold resin 62 attached to the joint part 100. As shown in FIG. 29, in the range from position Q1 at the −X-side end to position Q2 at the +X-side end of the joint part 100, the strength of adhesion is 4 N/cm or less. In addition, there are locations where the adhesion strength increases temporarily, such as one below position Q1 and one above position Q2, but the adhesion strength is 4 N/cm or less in other locations.

Note that the peeling test of the light emitting panel 20 and the flexible wiring substrate 40 was also conducted without cutting both ends of the protective tape 60. In this case, although the peeling durability was 15 N/cm or more in all places, this method was not employed because the amount of deformation of the light emitting device 10 was significant, the measured values varied significantly, and so forth, and therefore the accurate peeling strength between the light emitting panel 20 and the flexible wiring substrate 40 could not be measured.

<Adhesion Strength Test>

A test for the adhesion strength of the light emitting device 10 was conducted. In this case, too, the testing method was basically the same as the 90-degree peeling test in compliance with JIS K 6854-1: 1999. In the adhesion strength test, as shown in FIG. 28 and FIG. 31, a light emitting panel 20 was placed on a sturdy surface plate, and a substrate 21 was bonded to the surface plate. Regarding the bonding of the substrate 21, the +X-side region from position Q2 in FIG. 28 or the +X-side region from position P3 in FIG. 31 was bonded to the surface plate, to keep the horizontal state.

Figure 32:
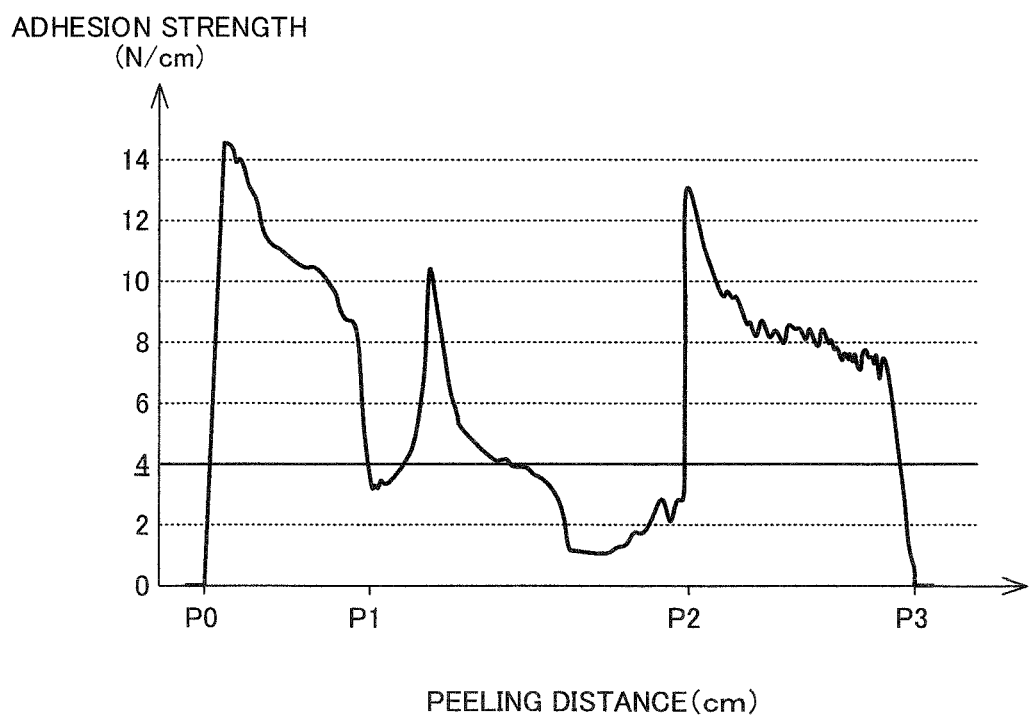
FIG. 32 is a diagram showing a result of the 90-degree peeling durability test.

Then, the flexible wiring substrate 40 was peeled from the light emitting panel by pulling the flexible wiring substrate 40 vertically upward, and, meanwhile, the adhesion strength (N/cm) was measured at each position. Next, as shown in FIG. 29 and FIG. 32, the relationship between adhesion strength (N/cm) and the peeling position was plotted, and, after peeling was started, the average value of adhesion strength (N/cm) from the point where the adhesion strength maximized first to the point where the adhesion strength minimized first was calculated, and this was determined as the adhesion strength of the light emitting device 10.

Note that, when the protective tape 60 was wound around the joint part 100 and its vicinity, or, to be more specific, when the protective tape 60 was wound around the portion of position P0 or position P3 in the light emitting device 10 illustrated in FIG. 31, both ends of the protective tape 60 when seeing the light emitting device 10 into the −Z direction were cut along the broken lines, as shown in FIG. 30, and the test was conducted. By so doing, the test was conducted in a state in which the protective tape 60 was separated vertically. The number of specimens in this test was five.

<Joint-Part Tensile-Reliability Test>

A test for the tensile reliability of the joint part of the light emitting device 10 was conducted. In this test of the tensile reliability of the joint part, as shown in FIG. 31, a light emitting panel 20 was placed on a sturdy surface plate, and a substrate 21 was bonded to the surface plate. As for the bonding of the substrate 21, the +X-side region from position Q2 in FIG. 28 or the +X-side region from position P3 in FIG. 31 was bonded to the surface plate, to maintain the horizontal state. Then, first, the flexible wiring substrate 40 was pulled vertically upward so that the tensile stress reaches from 0 N to 16 N in four seconds, and, after the flexible wiring substrate 40 was held, for five seconds, in a state in which the tensile stress was 16 N, the stress was released. This operation was repeated 5 times. Note that, unlike the average 90-degree peeling durability test, the test was conducted without cutting the protective tape 60.

After that, twenty light emitting devices 10 were left for 500 hours in an environment in which the temperature was 85° C. and the humidity was 85%, another twenty light emitting devices 10 were left for 1000 hours, and then electricity was applied to the light emitting devices 10. Then, the number of light emitting devices 10 in which none of the light emitting elements 30 on the light emitting panel 20 failed to light was counted.

<Joint-Part Repeated-Bending Reliability Test>

A test for the repeated-bending reliability of the joint part of the light emitting device 10 was conducted. In this test of the tensile reliability of the joint part, as shown in FIG. 31, a light emitting panel 20 was placed on a sturdy surface plate, and a substrate 21 was bonded to the surface plate. As for the bonding of the substrate 21, the +X-side region from position Q2 in FIG. 28 or the +X-side region from position P3 in FIG. 31 was bonded to the surface plate, to maintain the horizontal state. First, the flexible wiring substrate 40 was pulled vertically upward so that the tensile stress reaches from 0 N to 4 N in five seconds. Next, the flexible wiring substrate 40 was extended so that the tensile stress reaches from 4 N to 0 N in five seconds. These two actions make up one set, and this set was repeated 1000 times.

Note that, unlike the average 90-degree peeling durability test, the test was conducted without cutting the protective tape 60. After that, twenty light emitting devices 10 were left for 500 hours in an environment in which the temperature was 85° C. and the humidity was 85%, another twenty light emitting devices 10 were left for 1000 hours, and then electricity was applied to the light emitting device 10. Then, the number of light emitting devices 10 in which none of the light emitting elements 30 on the light emitting panel 20 failed to light was counted.

EXAMPLES

Next, specific examples and their evaluation results will be described.

Examples 1 to 4

In the light emitting panel 20 and the flexible wiring substrate 40 according to the above-described embodiments, as shown in FIG. 21, an anisotropic conductive film 65 with a separator was placed in end parts of the conductor patterns 23a and 23i that expose from +X-side end part of the light emitting panel 20, and the anisotropic conductive film 65 was bonded by thermo-compression at 160° C. for ten seconds. After that, the separator was peeled off. By this means, the anisotropic conductive film 65 was arranged over the conductor patterns 23a and 23i.

Next, as shown in FIG. 22, the conductor patterns 23a and 23i of the conductor layer 23 to constitute the light emitting panel 20 and the conductor layer 43 that is exposed from the end part of the flexible wiring substrate 40 are bonded by thermo-compression via the anisotropic conductive film 65, so that electrical contact is achieved between the conductor layer 23 and the conductor patterns 23a and 23i.

Next, four types of composite sealing materials 63, having different thicknesses of the mold resin 62, are prepared in such a length that it can be wound 1.5 times around the joint part 100 of the light emitting panel 20 and the flexible wiring substrate 40. Then, the composite sealing material 63 was wound around the joint part 100 of the light emitting panel 20 and the flexible wiring substrate 40, and then bonded by vacuum thermo-compression.

A polyimide film was used for the protective tape 60 for the composite sealing material 63, and an epoxy thermosetting resin was used for the mold resin 62. For the light emitting devices 10 according to examples 1 to 4, composite sealing materials 63 with mold resins 62 that were 60-μm thick, 80-μm thick, 100-μm thick and 120-μm thick were used, respectively. The joint part 100 was sealed by using composite sealing materials 63 (see FIG. 23), in which the mold resin 62 was stacked on the protective tape 60 and integrated in advance.

110 light emitting devices were manufactured following the above-described procedures, for each of the light emitting devices 10A to 10D according to examples 1 to 4. Then, for each of the four types of light emitting devices 10A to 10D, the cross-sectional void observation test and the infiltration search test, which have been described earlier herein, were conducted, using five light emitting devices each. The results are shown in FIG. 27. In all of the light emitting devices 10A to 10D, no void was found by observing cross-sections, and, furthermore, no infiltration of the infiltration solution was observed in the infiltration search test.

Similarly, the above-described average 90-degree peeling durability test and the adhesion strength test were conducted on ten light emitting devices for each. FIG. 32 is a diagram showing the result of the peeling durability test conducted for the light emitting device 10A of example 1 shown in FIG. 31. As shown in FIG. 32, the adhesion strength may fall to 4 N/cm or below in places between position P1 on the −X-side end and position P2 on the +X-side end of the joint part 100. However, the adhesion strength is always twice 4 N/cm or more in places from position P1 and below, down to position P0, or in places from position P2 and above, up to position P3. Note that position P0 is the −X-side end position of the mold resin 62, and position P3 is the +X-side end position of the mold resin 62.

That is, in the light emitting device 10 with the mold resin 62, the adhesion strength increases in portions on the +X side and the −X side of the joint part 100, and, therefore, the peeling of the joint part 100 is sufficiently suppressed by the mold resin 62. Note that the adhesion strength from position P0 to position P1 is the strength of adhesion between the mold resin 62 and the coverlay 42 of the flexible wiring substrate 40. Furthermore, the adhesion strength from position P2 to position P3 is the strength of adhesion between the mold resin 62 and the substrate 22 of the light emitting panel 20.

FIG. 33 shows the average value of ten samples of ten light emitting devices 10 in the average 90-degree peeling durability test. FIG. 34 shows the average value of the adhesion strength test of ten light emitting devices 10. Furthermore, forty light emitting devices 10 were used to test the tensile reliability of the joint part. After that, twenty light emitting devices 10 were left for 500 hours in an environment in which the temperature was 85° C. and the humidity was 85%, and another twenty light emitting devices 10 were left for 1000 hours. After that, electricity was applied to the light emitting devices 10. Then, the number of light emitting devices 10 in which none of the light emitting elements 30 on the light emitting panel 20 failed to light was counted. The results are shown in FIG. 33.

The results of the joint-part tensile reliability test showed that no samples of the light emitting devices 10A to 10D of examples 1 to 4 demonstrated lighting defects even after 500 hours of operation in the high-temperature, high-humidity test, or even after 1000 hours of operation. In addition, for examples 1 to 4, the repeated-bending reliability of the joint part was tested using forty light emitting devices for each of light emitting devices 10A to 10D. The results are shown in FIG. 34. No samples of light emitting devices 10A to 10D of examples 1 to 4 demonstrated lighting defects even after 500 hours of operation in the high-temperature, high-humidity test, or even after 1000 hours of operation.

Comparative Examples 1 and 2

Light emitting devices 10 according to comparative examples 1 and 2 are light emitting devices that are manufactured using composite sealing materials 63 with mold resins 62 that were 40-μm thick and 140-μm thick, respectively. Except for the thickness of the mold resins 62, the configuration and the manufacturing process were the same as those of the light emitting device 10A of example 1. With the light emitting devices 10 according to comparative examples 1 and 2, in some samples, voids and infiltration of the infiltration solution were observed, and the adhesion strength in the average 90-degree peeling durability test showed low values compared to the light emitting devices 10A to 10D of examples 1 to 4. Similar to the light emitting device 10A according to example 1, the tensile reliability of the joint part was tested, and the repeated-bending reliability of the joint part was tested. The results are shown in FIG. 33 and FIG. 34. In both tests, there were samples that demonstrated lighting defects.

Comparative Example 3

The light emitting device 10 according to comparative example 3 is a light emitting device, in which the joint part 100 is molded using an epoxy adhesive for the mold resin 62, to make its thickness 80 μm, without using a protective tape 60. The configuration and the manufacturing process were the same as those of the light emitting device 10A of example 1, except that no protective tape 60 was used. For the light emitting device 10 of comparative example 3, the cross-sectional void observation test, the infiltration search test, the average 90-degree peeling durability test, the adhesion strength test, the joint-part tensile reliability test and the joint-part repeated bending reliability test were conducted in the same procedures as with the light emitting device 10A according to example 1. The results are shown in FIG. 27, FIG. 33, and FIG. 34. In all tests, there were samples that demonstrated lighting defects.

Comparative Example 4

The light emitting device 10 according to comparative example 4 is a light emitting device that is manufactured by winding only the protective tape 60 around the joint part 100, without using a mold resin 62. The configuration and the manufacturing process were the same as those of the light emitting device 10A of example 1, except that no mold resin 62 was used. For the light emitting device 10 of comparative example 4, the cross-sectional void observation test, the infiltration search test, the average 90-degree peeling durability test, the adhesion strength test, the joint-part tensile reliability test and the joint-part repeated bending reliability test were conducted in the same procedures as with the light emitting device 10A according to example 1. The results are shown in FIG. 27, FIG. 33, and FIG. 34. All tests produced results that indicated severe unreliability.

Figure 41:
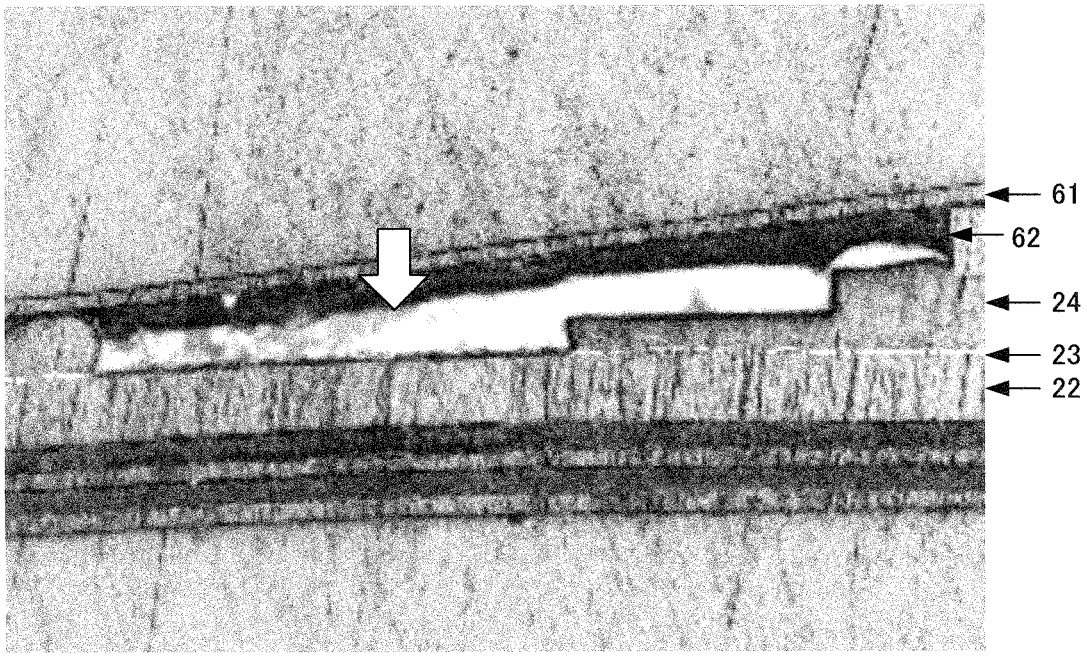
FIG. 41 is a photograph showing a cross-section of a joint-part of a light emitting panel and a flexible wiring substrate.

FIG. 41 is an image showing a cross-section of the light emitting device 10 according to comparative example 1. This image corresponds to the cross-section shown in FIG. 20. As shown in the photo of FIG. 41, with the light emitting device 10E, voids were observed at the locations indicated by the arrows. The white parts in the photo are voids. With the light emitting device 10 according to comparative example 1, in both of the cross-sectional void observation test and the infiltration search test, voids and infiltration of the penetration search solution were clearly observed.

On the other hand, as shown in FIG. 27, with the light emitting device 10A according to example 1, which used a composite sealing material 63 with a mold resin 62 that was 60-μm thick, no filling failure was confirmed with any of the five samples. Also, with the light emitting devices 1013, 10C and 10D according to examples 2 to 4 that used composite sealing materials 63 with mold resins 62 that were 80-μm thick, 100-μm thick and 120-μm thick, respectively, no filling failure of the mold resin 62 was confirmed in either of the cross-sectional void observation test and the infiltration search test.

Figure 42:
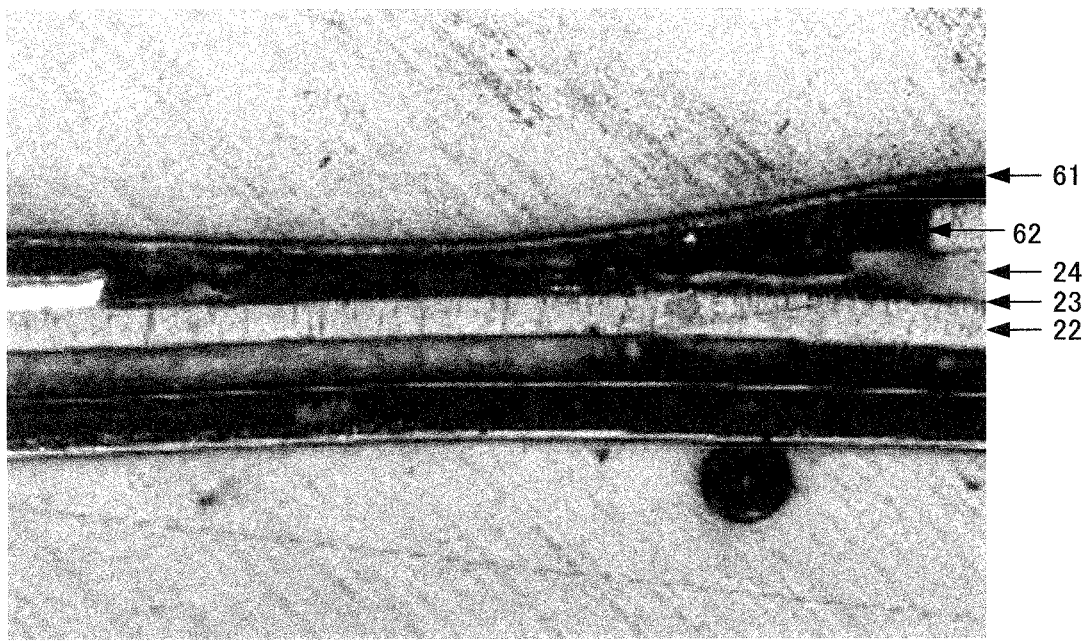
FIG. 42 is a photograph showing a cross-section of the joint-part of the light emitting panel and the flexible wiring substrate.

FIG. 42 is an image showing a cross-section of the light emitting device 10C according to example 3. This image corresponds to the cross-section shown in FIG. 20. As shown in the photo of FIG. 42, with the light emitting device 10C, the mold resin 62 is filled between the protective tape 60 and the substrate 22, without a gap.

When the light emitting device 10 according to comparative example 2 was used, the mold resin 62 flew out from position P3 in FIG. 31—that is, from an end of the composite sealing unit 61—onto the surface of the light emitting panel 20, covered part of the light emitting panel 20, and, as a result of this, partially damaged the translucency and visibility of the light emitting panel 20.

Example 5

With the light emitting device 10 according to example 5, an acrylic thermoplastic resin that was 80-μm thick was used for the mold resin 62 for constituting the composite sealing material 63, and a polyamide-based film was used for the protective tape 60. The thickness of the mold resin 62 was the same as in example 2. The configuration and the manufacturing process were both the same as those of the light emitting device 10A of example 1, except for the material and the thickness of the mold resin 62. Seventy light emitting devices 10 according to example 5 were manufactured. Then, following the same procedures as with the light emitting devices 10A to 10D according to examples 1 to 4, the above-described cross-sectional void observation test and infiltration search test were conducted for five light emitting devices 10 according to example 5, and, similarly, the above-described average 90-degree peeling durability test and adhesion strength test were conducted for ten light emitting devices 10E according to example 5. Furthermore, using forty light emitting devices 10 according to example 5, a joint-part repeated bending reliability test was conducted, in which one set of a tension operation and an extension operation was performed for 400 cycles and 1000 cycles.

Example 6

With the light emitting device 10 according to example 6, instead of polyimide, a 20-μm thick polyether ether ketone (PEEK) film was used for the protective tape 60 of the composite sealing material 63. A thermosetting polyimide resin was used for the mold resin. The configuration and the manufacturing process were both the same as those of the light emitting device 10A of example 1, except for the materials of the protective tape 60 and the mold resin 62. Seventy light emitting devices 10 according to example 6 were manufactured. Then, following the same procedures as with the light emitting devices 10A to 10D according to examples 1 to 4, the above-described cross-sectional void observation test and infiltration search test were conducted for five light emitting devices 10 according to example 6, and, similarly, the above-described average 90-degree peeling durability test and adhesion strength test were conducted for ten light emitting devices 10 according to example 6. Furthermore, using forty light emitting devices 10 according to example 6, a joint-part repeated bending reliability test was conducted, in which one set of a tension operation and an extension operation was performed for 400 cycles and 1000 cycles.

Examples 7 and 8, and Comparative Examples 5 and 6

Example 1 to 6 and comparative examples 1 to 4, which have been described above, are designed so that a gap of 2 mm is formed between an end surface of the light emitting panel 20 and an end surface of the flexible wiring substrate 40. Unless a gap is designed between an end surface of the light emitting panel 20 and an end surface of the flexible wiring substrate 40, the mold resin 62 cannot enter between these end surfaces, and there is a possibility that voids are formed, both end surfaces get too close and bulge up, and peeling occurs in the conductor layer of the flexible wiring substrate 40, in the joint part where the anisotropic conductive film is used, and so forth. In addition, if the gap between an end surface of the light emitting panel 20 and an end surface of the flexible wiring substrate 40 is too wide, the mold resin 62 may be filled unevenly, or the strength of adhesion may be reduced. Therefore, from the perspective of environmental reliability, an attempt was made to experimentally find out an appropriate distance between an end surface of the light emitting panel 20 and an end surface of the flexible wiring substrate 40.

In example 7 and comparative example 5, the light emitting devices 10 were assembled carefully so that the gap between an end surface of the light emitting panel 20 and an end surface of the flexible wiring board 40 was 1.3 mm and 0.8 mm, respectively. In addition, in example 8 and comparative example 6, the light emitting deices 10 were assembled carefully so that the gap between the end surface of the light emitting panel 20 and the end surface of the flexible wiring board 40 was 4.5 mm and 5.2 mm, respectively. In this way, the light emitting devices 10 according to examples 7 and 8 and comparative examples 5 and 6 were manufactured. In terms of other aspects, including material selection, the manufacturing process and so forth, the light emitting devices 10 were manufactured in completely the same manner as the light emitting device 10A according to example 1.

FIG. 27 shows values of gap dl between an end surface of the light emitting panel 20 and an end surface of the flexible wiring board 40 that were actually measured during the cross-sectional void observation of light emitting devices 10 according to examples 7 and 8 and comparative examples 5 and 6, that had been assembled. As shown in FIG. 27, it is clear that the light emitting devices 10 according to examples 7 and 8 and comparative examples 5 and 6 were manufactured as designed. With each sample, the cross-sectional void observation test, the infiltration search test, the average 90-degree peeling durability test, the adhesion strength test, the joint-part tensile reliability test, and the joint-part repeated bending reliability test were conducted in the same procedures as in the case of the light emitting device 10A according to example 1. The results are shown in FIG. 27, FIG. 33, and FIG. 34. From these results, it was found out that sufficiently reliable connection could not be achieved unless gap dl between an end surface of the light emitting panel 20 and an end surface of the flexible wiring board 40 was 1 mm or more and 5 mm or less.

Of the examples and comparative examples described above, correlations among the reliability test, the peeling durability and the adhesion strength were examined, based on a regression analysis, with respect to examples where not all samples lit after 500 hours of operation or 1000 hours of operation in the high-temperature and high-humidity test following the test of the tensile reliability of the joint part and/or the test of the repeated-bending reliability of the joint part.

Determining coefficient $R^2$ of the polynomial regression curve between the results of the tensile reliability test for the joint part and the peeling durability was 0.711, while determining coefficient $R^2$ of the polynomial regression curve between the results of the tensile reliability test for the joint part and the adhesion strength was 0.691. Therefore, it is possible to say that the results of the tensile reliability test for the joint part are more strongly correlated with the peeling durability. To ensure the tensile reliability of the joint part, the peeling durability needs to be at least 4 N/cm or more, preferably 6 N/cm or more, and more preferably 8 N/cm or more, even under the high-temperature and high-humidity environment, normally required for automotive parts that need to operate for 1000 hours in an environment in which the temperature is 85° C. and the humidity is 85%. However, the data of example 5 is not included. The reason for this arises from the material-specific problem that acrylic resins are susceptible to degenerate at high temperature and high humidity.

Next, of the examples and comparative examples described above, correlations among the reliability test, the peeling durability and the adhesion strength were examined, based on a regression analysis, with respect to examples where not all samples lit after 500 hours of operation or 1000 hours of operation in the high-temperature and high-humidity test following the test of the tensile reliability of the joint part and/or the test of the repeated-bending reliability of the joint part.

Determining coefficient $R^2$ of the polynomial regression curve between the results of the repeated-bending reliability test for the joint part and the peeling durability was 0.847, while determining coefficient $R^2$ of the polynomial regression curve between the results of the tensile reliability test for the joint part and the adhesion strength was 0.864. Therefore, it is possible to say that the results of the repeated-bending reliability test for the joint part are more strongly correlated with the adhesion strength.

To ensure the repeated-bending reliability of the joint part, the adhesion strength needs to be at least 6 N/cm or more, preferably 8 N/cm or more, even under the high-temperature and high-humidity environment, normally required for automotive parts that need to operate for 1000 hours in an environment in which the temperature is 85° C. and the humidity is 85%. However, the data of example 7 is not included. The reason for this arises from the material-specific problem that acrylic resins are susceptible to degenerate at high temperature and high humidity.

Figure 38:
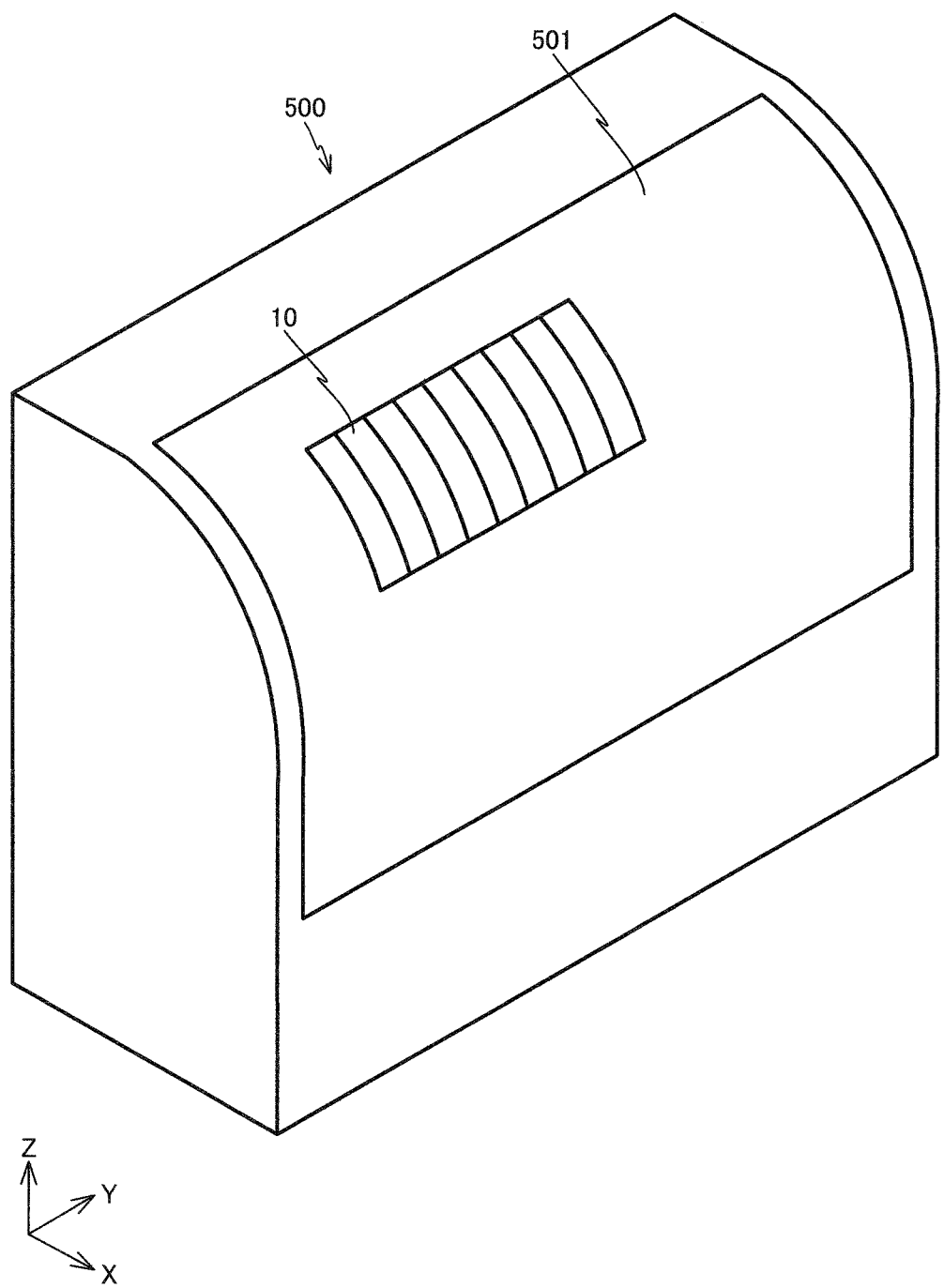
FIG. 38 is a diagram showing a manner of use of a light emitting device.

The light emitting devices 10 according to the herein-contained embodiments are flexible. Consequently, as shown in FIG. 38, for example, a light emitting device 10 according to an embodiment can be used to decorate a showcase 500 or the like that displays goods and the like over a curved glass 501. Even if the light emitting device 10 is arranged on the curved glass 501, it is possible to display goods through the light emitting device 10. Consequently, it is possible to show messages using the light emitting device 10, without damaging the display of goods. By arranging a plurality of light emitting devices 10 side by side, display to suit the size of the showcase 500 becomes possible. The light emitting device 10 can be used to provide various decorations and messengers as well as decorations for showcases and show windows.

Figure 39:
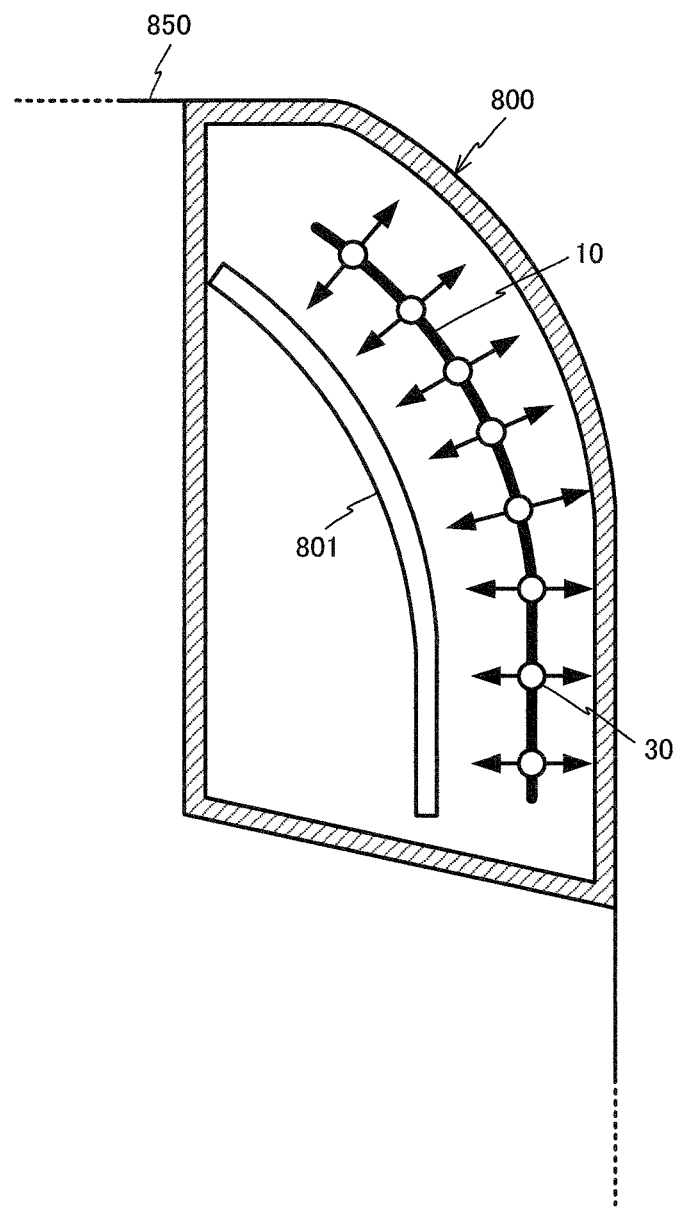
FIG. 39 is a diagram showing a manner of use of a light emitting device.

The light emitting devices 10 according to the herein-contained embodiments can be used for tail lamps for vehicles. By using a light emitting device 10, which is translucent and flexible, as a light source, various visual effects can be produced. FIG. 39 is a diagram to show, schematically, a cross-section of a resin casing in a horizontal plane, and its internal structure, with respect to a tail lamp 800 for a vehicle 850. The light emitting device 10 is arranged along the inner wall surface of the resin casing of the tail lamp 800, and a mirror 801 is arranged on the back surface of the light emitting device 10, so that light that is emitted from the light emitting device 10 toward the mirror 801 is reflected by the mirror 801, and then passes through the light emitting device 10, and is emitted to the outside. By this means, a unit that is configured as if having a light source apart from the light emitting device 10 in the depth direction of the tail lamp 800 can be formed.

The light emitting devices 10 according to the above-described embodiments have assumed that the light emitting elements 30 are arranged on a straight line as shown in FIG. 4. This is by no means limiting, and, for example, as shown in FIG. 40, the light emitting elements 30 may be arranged in a matrix shape on a two-dimensional plane.

Although embodiments of the present invention have been described above, the method of manufacturing light emitting devices 10 is disclosed in detail in US Patent Application Publication No. 2017/0250330 (WO/2016/047134). As shown in FIG. 40, a light emitting device in which light emitting elements are arranged in a matrix shape is disclosed in detail in Japanese Patent Application No. 2018-164963. Their contents are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A light emitting device comprising:
   a light emitting panel comprising:
      a first substrate, which is flexible,
      a plurality of conductor patterns, which are formed on a surface of the first substrate,
      a plurality of light emitting elements, each of which is connected to at least two of the conductor patterns, and
      a resin layer, which holds the light emitting elements on the first substrate;
   a wiring substrate comprising:
      an insulating base, and
      a circuit pattern that is formed on the insulating base and electrically connected with an exposed part of the conductor patterns that is exposed from an end part of the resin layer; and
   a mold resin, which covers part of the conductor patterns and part of the circuit pattern, and which covers the end part of the resin layer and an end part of the insulating base.

2. The light-emitting device according to claim 1, further comprising:
   a protective tape, which is affixed around a joint part of the light emitting panel and the wiring substrate.

3. The light-emitting device according to claim 1, wherein the first substrate comprises at least one of polyethylene terephthalate (PET), polyethylene naphthalate (PEN), polycarbonate (PC), polyethylene succinate (PES), cyclic olefin resin, acrylic resin or polyimide.

4. The light-emitting device according to claim 1, wherein the light emitting element comprises a pair of electrodes located at a first surface of the light emitting element, the pair of electrodes being connected to respective ones of the plurality of conductor patterns.

5. The light-emitting device according to claim 1, wherein the conductor patterns and the circuit pattern are connected using an anisotropic conductive film.

6. The light-emitting device according to claim 1, wherein the wiring substrate comprises a connector.

7. The light emitting device according to claim 1, wherein the mold resin is filled between the end part of the resin layer and an end part of the wiring substrate.

8. The light emitting device according to claim 1, further comprising a second substrate, which is arranged to face the first substrate with the plurality of light emitting elements located between the first substrate and the second substrate.

9. The light-emitting device according to claim 8, wherein the second substrate comprises at least one of polyethylene terephthalate (PET), polyethylene naphthalate (PEN), polycarbonate (PC), polyethylene succinate (PES), cyclic olefin resin, acrylic resin or polyimide.

10. The light-emitting device according to claim 2, wherein the protective tape is made of a material that is heat resistant and insulative.

11. The light-emitting device according to claim 8, wherein:
the second substrate faces the surface of the first substrate on which the conductor pattern is formed, and
a thickness of the conductor pattern is not less than 0.05 µm and not more than 2.0 µm.

12. The light-emitting device according to claim 8, wherein:
the resin layer is an insulator that is formed between the first substrate and the second substrate, and
a thickness of the mold resin is not less than 50 µm and not more than 100 µm.

13. The light-emitting device according to claim 8, wherein the first substrate and the second substrate comprise at least one of polyethylene terephthalate (PET), polyethylene naphthalate (PEN), polycarbonate (PC), polyethylene succinate (PES), cyclic olefin resin, acrylic resin or polyimide.

14. The light-emitting device according to claim 8, wherein the first substrate and the second substrate have curved shapes so that parts where the plurality of the light emitting elements are arranged protrude outward.

15. The light-emitting device according to claim 8, wherein, in a top view, the first substrate and the second substrate are rectangular, the first substrate and the second substrate are transparent to visible light, and a total luminous transmittance of the first substrate and the second substrate is not less than 5% and not more than 95%.

16. The light-emitting device according to claim 15, wherein the first substrate is a film-like member.

17. The light-emitting device according to claim 1, wherein the first substrate has a total light transmittance of 5% or more and 95% or less.

* * * * *